(12) United States Patent
Zhang et al.

(10) Patent No.: US 11,665,885 B2
(45) Date of Patent: May 30, 2023

(54) SEMICONDUCTOR MEMORY DEVICE

(71) Applicant: Fujian Jinhua Integrated Circuit Co., Ltd., Quanzhou (CN)

(72) Inventors: Janbo Zhang, Zhangzhou (CN);
Chao-Wei Lin, Hsinchu County (TW);
Chia-Yi Chu, Hsinchu (TW);
Yu-Cheng Tung, Kaohsiung (TW);
Ken-Li Chen, Taoyuan (TW);
Tsung-Wen Chen, Taipei (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/317,923

(22) Filed: May 12, 2021

(65) Prior Publication Data

US 2021/0375878 A1    Dec. 2, 2021

(30) Foreign Application Priority Data

May 29, 2020    (CN) .......................... 202010478418.9
Nov. 12, 2020    (CN) .......................... 202011264281.3

(51) Int. Cl.
*H01L 27/10*      (2006.01)
*H01L 23/532*    (2006.01)

(52) U.S. Cl.
CPC ....... *H10B 12/315* (2023.02); *H01L 23/5329* (2013.01); *H10B 12/482* (2023.02); *H10B 12/488* (2023.02)

(58) Field of Classification Search
CPC .......... H01L 27/10814; H01L 23/5329; H01L 27/10885; H01L 27/10891; H01L 21/7682; H01L 27/10855; H10B 12/315; H10B 12/482; H10B 12/488; H10B 12/0335
See application file for complete search history.

(56) References Cited

U.S. PATENT DOCUMENTS

| | | | |
|---|---|---|---|
| 2016/0351501 A1* | 12/2016 | Chun | H01L 27/1085 |
| 2017/0271340 A1* | 9/2017 | Kim | H01L 27/10855 |
| 2018/0174971 A1* | 6/2018 | Song | H01L 27/10888 |
| 2018/0211964 A1* | 7/2018 | Feng | H01L 21/764 |
| 2019/0296873 A1* | 9/2019 | Gupta | H04B 7/024 |
| 2021/0057339 A1* | 2/2021 | Lee | H01L 23/5226 |

* cited by examiner

*Primary Examiner* — Shouxiang Hu
(74) *Attorney, Agent, or Firm* — Winston Hsu

(57) ABSTRACT

A semiconductor memory device is provided in the present invention, including a substrate, word lines in the substrate, bit lines over the word lines, partition structures between the bit lines and right above the word lines, storage node contacts in spaces defined by the bit lines and the partition structures and electrically connecting with the substrate, wherein a portion of the storage node contact protruding from top surfaces of the bit lines and the partition structures is contact pad, and contact pad isolation structures on the partition structures and between the contact pads, wherein the contact pad isolation structure includes outer silicon nitride layers and inner silicon oxide layers.

11 Claims, 18 Drawing Sheets

SEMICONDUCTOR MEMORY DEVICE

BACKGROUND OF THE INVENTION

1. Field of the Invention

The present invention relates generally to a semiconductor device, and more specifically, to a semiconductor device with particular isolation structures between storage node contact pads and method of manufacturing the same.

2. Description of the Prior Art

Semiconductor devices are widely used in the electronics industry because of small size, multi-function, and/or low manufacture costs thereof. The semiconductor devices may be categorized as any one of semiconductor memory devices storing logic data, semiconductor logic devices processing operations of logical data, and hybrid semiconductor devices having both the function of the semiconductor memory devices and the function of the semiconductor logic devices.

Generally, a semiconductor device may include vertically stacked patterns and contact plugs for electrically connecting the patterns to each other. As the semiconductor devices have been highly integrated, a space between patterns and/or a space between a pattern and a contact plug may be more and more reduced. Thus, a parasitic capacitance between patterns and/or between a pattern and a contact plug may increase. The parasitic capacitance may cause performance deterioration of the semiconductor device, such as reduction of an operation speed.

SUMMARY OF THE INVENTION

In the light of the aforementioned conventional problem encountered in the semiconductor device, the present invention hereby provides a novel semiconductor device and method of manufacturing the same, featuring the particular isolation structure between the storage node contact pads to lower total K-value and parasite capacitance of the device.

One aspect of present invention is to provide a semiconductor memory device, including a substrate, word lines extending in a first direction in the substrate, bit lines extending in a second direction over the word lines, partition structures between the bit lines and right above the word lines, storage node contacts in spaces defined by the bit lines and the partition structures and electrically connecting with the substrate, wherein a portion of the storage node contact protruding from top surfaces of the bit lines and the partition structures is contact pad, and contact pad isolation structures on the partition structures and between the contact pads, wherein the contact pad isolation structure includes outer silicon nitride layers and inner silicon oxide layers.

Another aspect of present invention is to provide a semiconductor memory device, including a substrate, word lines extending in a first direction in the substrate, bit lines extending in a second direction over the word lines, partition structures between the bit lines and right above the word lines, storage node contacts in spaces defined by the bit lines and the partition structures and electrically connecting with the substrate, wherein a portion of the storage node contact protruding from top surfaces of the bit lines and the partition structures is contact pad, and contact pad isolation structures on the partition structures and between the contact pads, wherein air gaps are formed inside the contact pad isolation structures.

Still another aspect of present invention is to provide a method of manufacturing a semiconductor memory device, including steps of providing a substrate, forming word lines extending in a first direction in the substrate, forming bit lines extending in a second direction over the word lines, forming partition structures between the bit lines and right above the word lines, forming storage node contacts in spaces defined by the bit lines and the partition structures, wherein a portion of the storage node contact protruding from top surfaces of the bit lines and the partition structures is contact pad, and forming a silicon nitride liner on the contact pads, the bit lines and the partition structures, and forming a silicon oxide layer on the silicon nitride liner.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
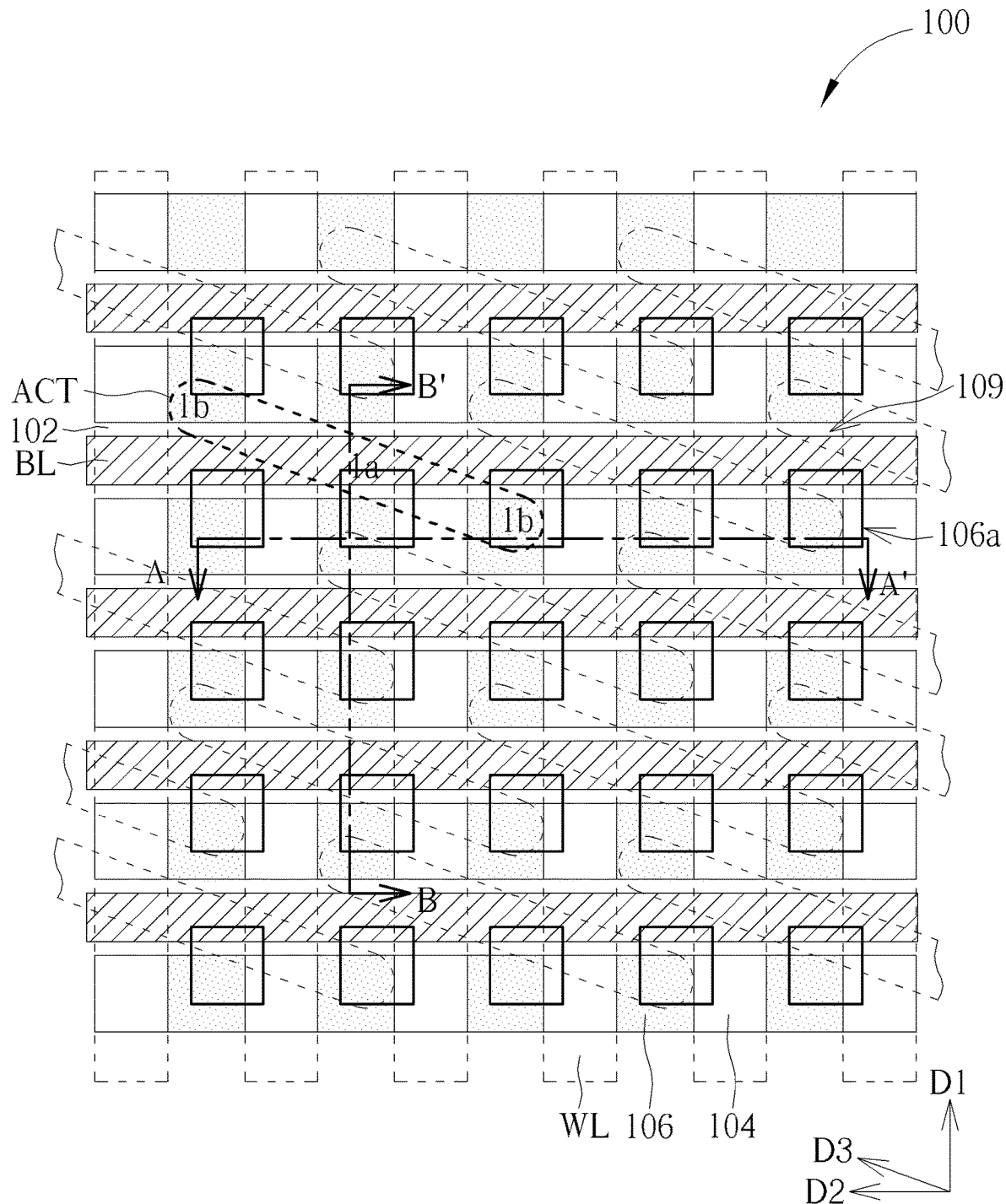
FIG. 1, FIG. 4, FIG. 9 and FIG. 13 illustrate plane views of a semiconductor memory device in accordance with various embodiments of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain non-patterned. Furthermore, the substrate can include a wide array of semiconductor materials, such as silicon, germanium, gallium arsenide, indium phosphide, etc.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In drawings of the present invention, FIG. 1, FIG. 4, FIG. 9 and FIG. 13 illustrate plane views of a semiconductor memory device in accordance with various embodiments of the present invention, FIG. 1A, FIG. 2A, FIG. 3A, FIG. 4A, FIG. 5A, FIG. 6A, FIG. 7A, FIG. 8A, FIG. 9A, FIG. 10A, FIG. 11A, FIG. 12A and FIG. 13A are cross-sectional views taken along a section line A-A' in FIG. 1 in the manufacturing process, and FIG. 1B, FIG. 2B, FIG. 3B, FIG. 4B, FIG. 5B, FIG. 6B, FIG. 7B, FIG. 8B, FIG. 9B, FIG. 10B, FIG. 11B, FIG. 12B and FIG. 13B are cross-sectional views taken along a section line B-B' in FIG. 1 in the manufacturing process.

First, please refer to FIG. 1. The semiconductor memory device of present invention is manufactured on a semiconductor substrate 100, for example a silicon (Si) substrate, germanium (Ge) substrate and/or silicon-germanium (SiGe) substrate. The semiconductor substrate 100 is provided with cell regions and peripheral regions surrounding the cell regions. The cell region is used to set storage cells (or referred as storage nodes) of the semiconductor memory device. Multiple storage nodes are arranged in an array in the cell region and may store charges to provide distinctive voltage states. The peripheral region is used to set peripheral circuits of the memory device, for example column decoders, row decoders, sense amplifiers or I/O control modules. Since the key features of present invention are not relevant to the peripheral region, only components and features presented in the cell region will be shown in the figure. Active areas ACT are defined in the cell region of semiconductor substrate 100. Every active area is isolated by surrounding device insolating layer. In the process, isolated active areas ACT may be formed by performing a photolithography process to the semiconductor substrate 100 and filling up the recesses formed between the active areas ACT with insulating materials, such as silicon oxide, to form the device isolating layer. In the example, the active area ACT is rod-shaped in the plane view and is provided with a major axis extending in a third direction D3. Multiple active areas ACT are formed uniformly on the substrate surface in a staggered arrangement.

Refer still to FIG. 1. Multiple word lines WL are set in the semiconductor substrate 100, wherein the word lines WL are spaced apart in parallel at a predetermined spacing and extend in a first direction D1 through the cell region. Multiple bit lines BL are further set on the semiconductor substrate 100, wherein the bit lines BL are spaced apart in parallel at a predetermined spacing and extend in a second direction D2 through the cell region. The second direction D2 is preferably perpendicular to the first direction D1, and an included angle between the third direction D3 and the first direction D1 is preferably between 45 and 90 degrees, and an included angle between the third direction D3 and the second direction D2 is preferably between 0 and 45 degrees. Word lines WL are usually buried within the semiconductor substrate 100 to function as access transistors to control the switch of gates and the access of charges (see FIG. 1A), while bit lines BL are usually set on the semiconductor substrate 100 (see FIG. 1B) crossing over the word lines WL and connecting with the active areas ACT to conduct write and read actions. Spacers 102 are further formed surrounding the bit lines BL to isolate the bit lines BL from adjacent components.

Refer still to FIG. 1. Multiple partition structures 104 are set between the bit lines BL on the semiconductor substrate 100, at positions roughly above the word lines WL and spaced apart from each other at a spacing. In the cell region, the partition structures 104 and the bit lines BL may collectively define storage node areas on the semiconductor substrate 100 for storage node contacts 106 to be set and connected thereon. In real implementation, components such as capacitors for charge storage may be further set on the storage node contacts 106. They will be described and shown in following embodiment and figures.

After describing the plane layout of semiconductor memory device of the present invention, the following sections will describe the relative positions and connections in vertical direction between the components of semiconductor memory device in different embodiments of the present invention. First, please refer collectively to FIG. 1A and FIG. 1B, which illustrate the cross-sectional structures of semiconductor memory device, including the components of word lines WL, bit line BL and the storage node contacts 106, wherein FIG. 1A is taken along the section line A-A' in FIG. 1 cutting through the partition structures 104 and the storage node contacts 106 in the second direction D2, and FIG. 1B is taken along the section line B-B' in FIG. 1 cutting through the bit lines BL and the storage node contacts 106 in the first direction D1.

Figure 1A:
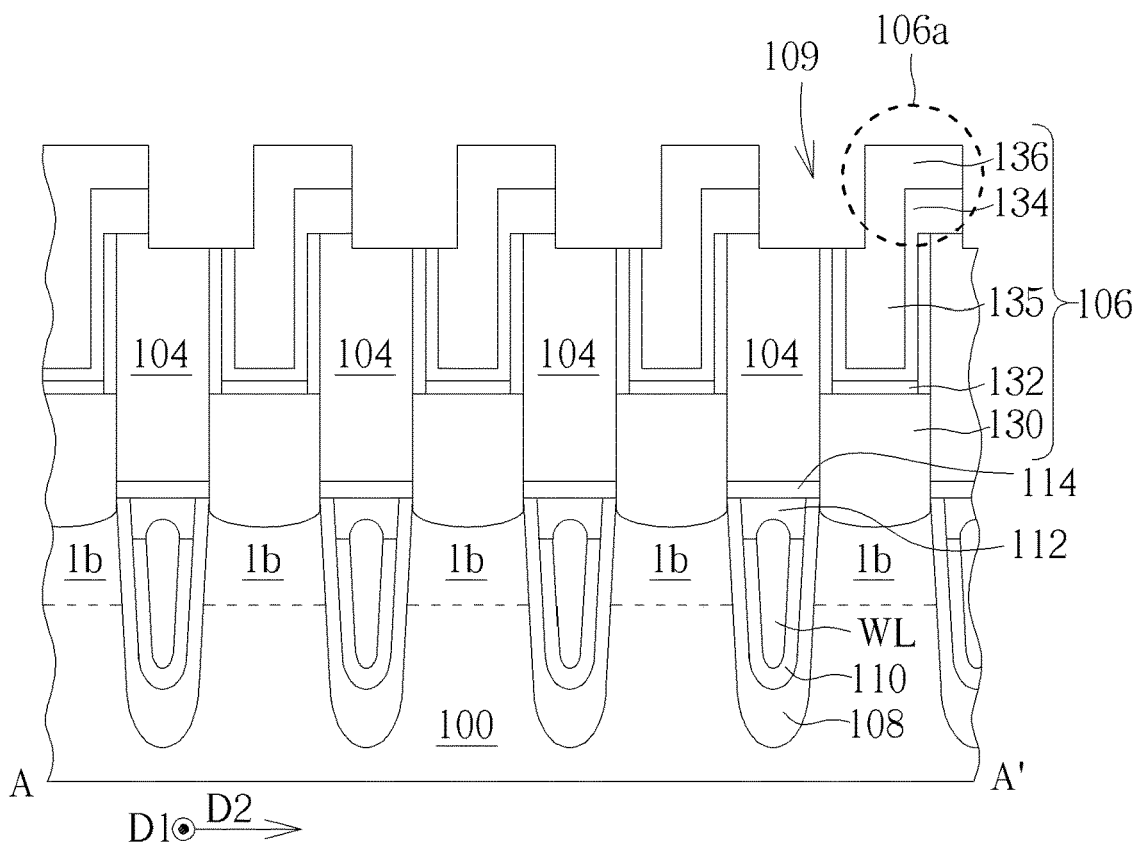
FIG. 1A, FIG. 2A, FIG. 3A, FIG. 4A, FIG. 5A, FIG. 6A, FIG. 7A, FIG. 8A, FIG. 9A, FIG. 10A, FIG. 11A, FIG. 12A and FIG. 13A are cross-sectional views taken along a section line A-A' in FIG. 1 in the manufacturing process.
Figure 1B:
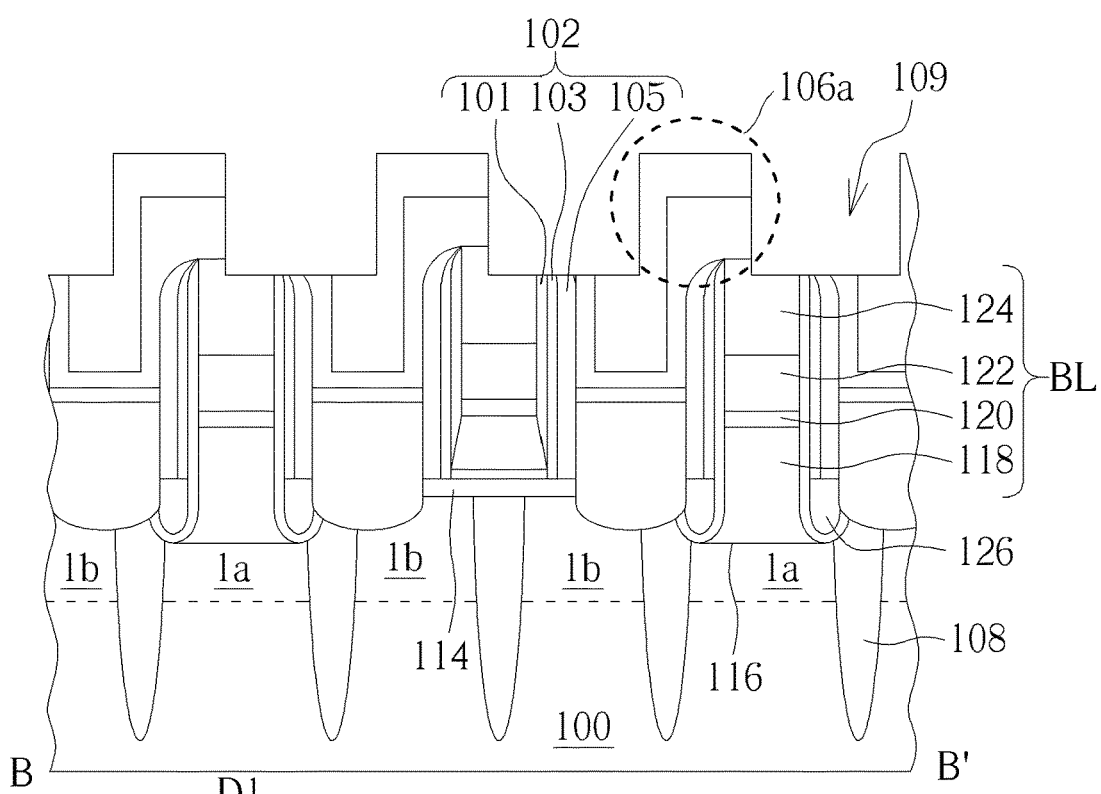
FIG. 1B, FIG. 2B, FIG. 3B, FIG. 4B, FIG. 5B, FIG. 6B, FIG. 7B, FIG. 8B, FIG. 9B, FIG. 10B, FIG. 11B, FIG. 12B and FIG. 13B are cross-sectional views taken along a section line B-B' in FIG. 1 in the manufacturing process.

As shown in FIG. 1A and FIG. 1B. Firstly, a device isolating layer 108 for defining and isolating the active areas ACT is formed in the semiconductor substrate 100. The semiconductor substrate 100 may include silicon (Si) substrate, germanium (Ge) substrate and/or silicon-germanium (SiGe) substrate. The device isolating layer 108 may be formed by a method of performing a photolithography process to the semiconductor substrate 100 to form isolated active areas ACT and filling the recesses formed between the active areas ACT with insulating materials, such as silicon oxide. In the example, the active area ACT is rod-shaped in the plane view and is provided with a major axis extending in the third direction D3. Multiple active areas ACT are formed uniformly on the plane in a staggered arrangement (see FIG. 1).

Multiple word lines WL extending in the first direction D1 are formed in the semiconductor substrate 100. In the example, the device isolating layer 108 may be patterned by photolithography processes to form gate recessed areas extending in the first direction D1, and gate insulating layers 110 may be formed in the gate recessed areas. Thereafter, word lines WL may be formed on the gate insulating layer 110 in corresponding gate recessed areas. The material of word line WL may be metal, such as tungsten (W), aluminum (Al), titanium (Ti) and/or tantalum (Ta). The bottom surface of gate recessed area may be designedly higher than the bottom surface of device isolating layer 108. The top surface of word line WL may be designedly lower than the top surface of device isolating layer 108. After forming the word lines WL, gate hard mask patterns 112, such as a silicon nitride (SiN) layer, are then formed on remaining gate recessed areas on the word lines WL.

Refer still to FIG. 1A and FIG. 1B. After forming the gate hard mask patterns 112, first doped regions 1a and second doped regions 1b may then be formed respectively at two sides of the word lines WL. The doped regions may be formed by ion implantation processes and may include dopants with conductive type opposite to the conductive type of the active areas ACT, wherein the cross-section of FIG. A only cuts through the second doped regions 1b of active areas ACT. The bottom boundary of first doped regions 1a and the second doped regions 1b may be kept at a predetermined depth below the top surface of active areas ACT. One first doped region 1a is located in the center of each active area ACT, which will be electrically connected with a corresponding bit line BL in latter processes. Two second doped regions 1b are located at two ends of each active area ACT, which will be electrically connected with corresponding storage node contacts 106 in latter processes. In addition, an insulating layer 114 may be formed on the surface of semiconductor substrate 100 to isolate lower active areas ACT from upper components. The insulating layer 114 may be formed by single insulating film or several insulating films, such as silicon nitride (SiN) layer, silicon oxide (SiO) layer and/or silicon oxynitride (SiON) layer.

In the example, the semiconductor substrate 100 and the insulating layer 114 may be patterned by a photolithography process to form recessed regions 116 exposing the first doped regions 1a below (see FIG. 1B). In some embodiments, the recessed regions 116 may be formed by an anisotropic etching process. In this case, parts of the device isolating layer 108 adjacent to the first doped regions 1a are also etched. The bottom surface of recessed region 116 may be higher than the bottom surface of first doped regions 1a (as indicated by the dashed line), and parts of the device isolating layer 108 may be exposed from the recessed region 116.

Refer still to FIG. 1A and FIG. 1B. Bit lines BL extending in the second direction D2 are formed on the semiconductor substrate 100. The bit line BL may include a polysilicon layer 118, a silicide layer 120, a metal layer 122 and a hard mask layer 124 from the bottom up. In the example, the polysilicon layer 118 may be doped polysilicon, the metal layer 122 may be tungsten (W), aluminum (Al), titanium (Ti) or tantalum (Ta), and the hard mask layer 124 may be non-conductive silicon nitride (SiN). A part of the polysilicon layer 118 may be formed in the recessed region 116 to function as a bit line contact directly contacting the first doped region 1a. In addition, the min-width of recessed region 116 is greater than the width of each bit line BL to provide better landing environment. Insulating structure are formed on the sidewalls of bit line BL to prevent the bit line BL from electrically connecting to adjacent components. The insulating structure may include bit line contact isolating structures 126 at two sides of the recessed region 116 and spacers 102 covering on the sidewalls of every bit line BL (see FIG. 1B). The material of bit line contact isolating structure 126 may be silicon oxide (SiO), silicon nitride (SiN), silicon oxynitride (SiON) or the combination thereof. The material of spacer 102 may be silicon oxide (SiO), silicon nitride (SiN) or the combination thereof. More specifically, in the embodiment, the spacer 102 may be an ONO trilayer structure including an inner first spacer layer 101 (silicon oxide layer), a middle second spacer layer 103 (silicon nitride layer) and an outer third spacer layer 105 (silicon oxide layer) to provide better isolation property.

In the example, the partition structures 104 are formed directly above the word lines WL and between the bit lines BL, so that the partition structures 104 and the bit lines BL may collectively partition and define multiple space on the semiconductor substrate 100. Each space corresponds to a storage node area locating directly on the second doped region 1b of active area ACT, wherein storage node contacts 106 are designed to be formed in the spaces. The partition structures 104 may be formed of silicon nitride. In the example, the storage node contact 106 may include a polysilicon layer 130, a silicide layer 132, a barrier layer 134 and a metal layer 136 from the bottom up. The polysilicon layer 130 of storage node contacts 106 may be doped polysilicon, which pass through the insulating layer 114 to directly contact the second doped region 1b of active area ACT. In the example, the bottom surface of polysilicon layer 130 of the storage node contacts 106 may be lower than the top surface of semiconductor substrate 100 and higher than the bottom surface of polysilicon layer 118 of the bit line BL (see FIG. 1B). The silicide layer 132 may include titanium silicide (TiSi), cobalt silicide (CoSi), nickel silicide (NiSi), tungsten silicide (WSi), platinum silicide (PtSi) and/or molybdenum silicide (MoSi). The metal layer 136 may be tungsten (W), aluminum (Al), titanium (Ti) or tantalum (Ta). The barrier layer 134 may be the nitride of tungsten (W), aluminum (Al), titanium (Ti) or tantalum (Ta). In the example, the portion of storage node contact 106 protruding from the top surface of bit lines BL and partition structures 104 is commonly referred as a storage node contact pad, which is abbreviated hereinafter as contact pad 106a. In real implementation, components such as capacitors for charge storage may be further set on the contact pad 106a of storage node contact 106. They will be described and shown in following embodiment and figures.

In the embodiment, the storage node contacts 106 and the contact pads 106a may be formed by first depositing the barrier layer 134 and the metal layer 136 sequentially on the semiconductor substrate 100. The barrier layer 134 and the metal layer 136 are formed filling up the spaces (i.e. on storage node areas) partitioned by the partition structures 104 and the bit lines BL and covering the top surfaces of partition structures 104 and the bit lines BL. A photolithography process is then performed to pattern the barrier layer 134 and the metal layer 136 on the top surfaces of partition structures 104 and the bit lines BL to form individual contact pads 106 and storage node contacts 106, as shown in FIG. 1A and FIG. 1B. Each storage node contacts 106 is composed of a plug portion 135 between the partition structures 104 and the bit lines BL and a contact pads 106a above the surface.

Please note that in the preferred embodiment, as shown in FIG. 1, the contact pad 106a is shifted designedly from its original location of storage node contacts 106. More specifically, the contact pad 106a is shifted by a distance in the first direction D1 and the second direction D2 to partially overlap adjacent bit line BL and partition structure 104. A part of the contact pad 106a is formed on the bit line BL and partition structure 104, and a recess 109 is formed between the contact pads 106. The shifted contact pads 106a may be formed by modifying the locations of contact pad patterns in the photolithography process for patterning and forming the storage node contacts 106. It can be seen in FIG. 1A and FIG. 1B that parts of the bit lines BL and the partition structures 104 are also removed in the patterning process, wherein the recess 109 formed between the contact pads 106a would expose the spacer 102 on one side of the bit line BL, including the first spacer layer 101, the second spacer layer 103 and the third spacer layer 105.

Figure 2A:
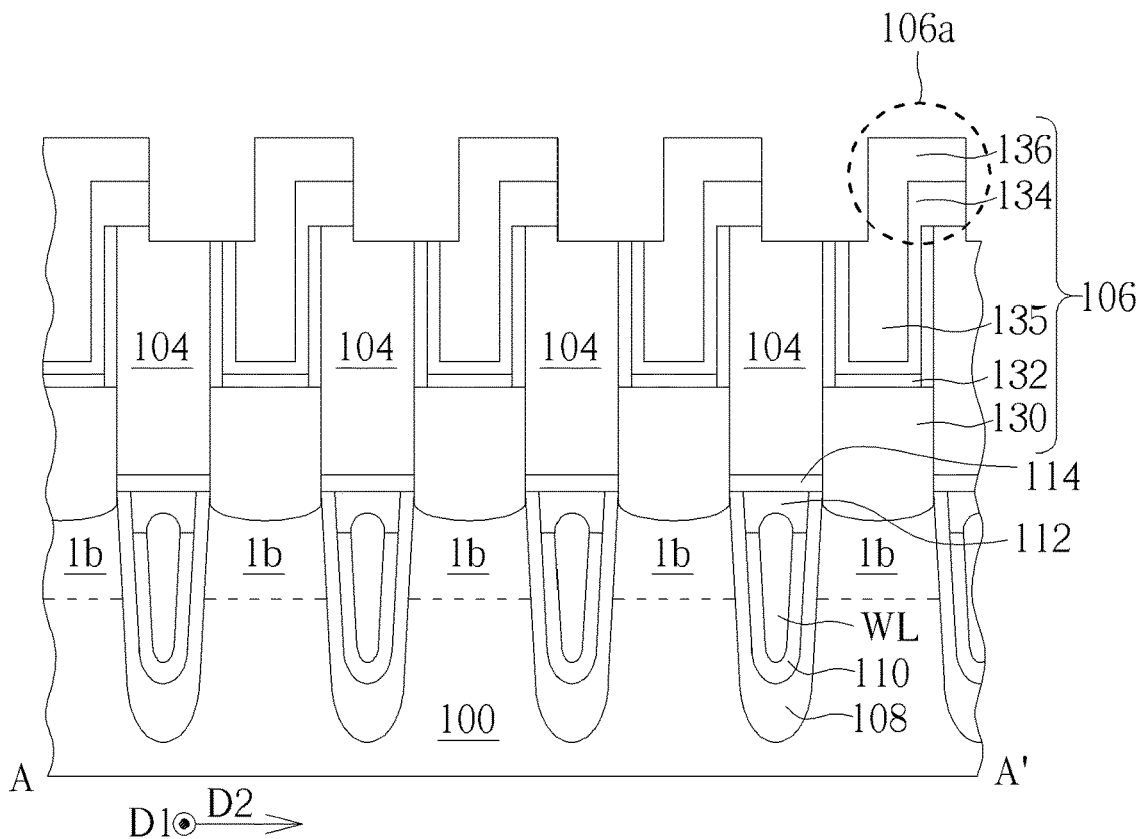
Figure 2B:
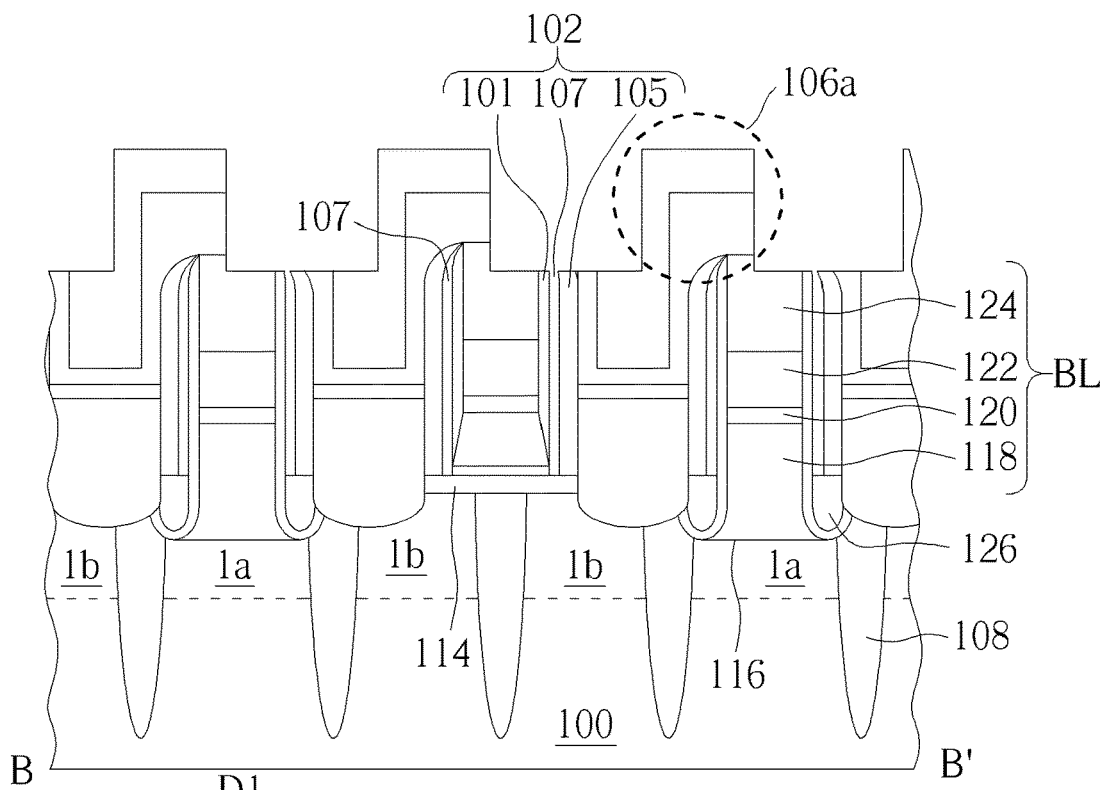

Please refer now to FIG. 2A and FIG. 2B. After forming the storage node contacts 106 and the contact pads 106a, an etching process is then perform to selectively remove the second spacer layer 103 of spacer 102. The selective etching may be achieved in this process since the material of second spacer layer 103 (preferably silicon nitride) is different from the ones of first spacer layer 101 and third spacer layer 105 (preferably silicon oxide). An air gap 107 will be formed between the first spacer layer 101 and the third spacer layer 105 after the second spacer layer 103 is removed. Please note that the second spacer layer 103 on the opposite sidewall of each bit line BL will also be removed from the spacer 102 exposed by the recesses 109 not shown in FIG. 2A and FIG. 2B (but may be presented in other cross-sections). In this way, the spacer 102 become a sandwich structure including an inner first spacer layer 101, a middle air gap 107 and an outer third spacer layer 105 as shown in FIG. 2B. The air gap 107 at two sides of each bit line BL may provide better isolation between bit lines BL and storage node contacts 106.

Figure 3A:
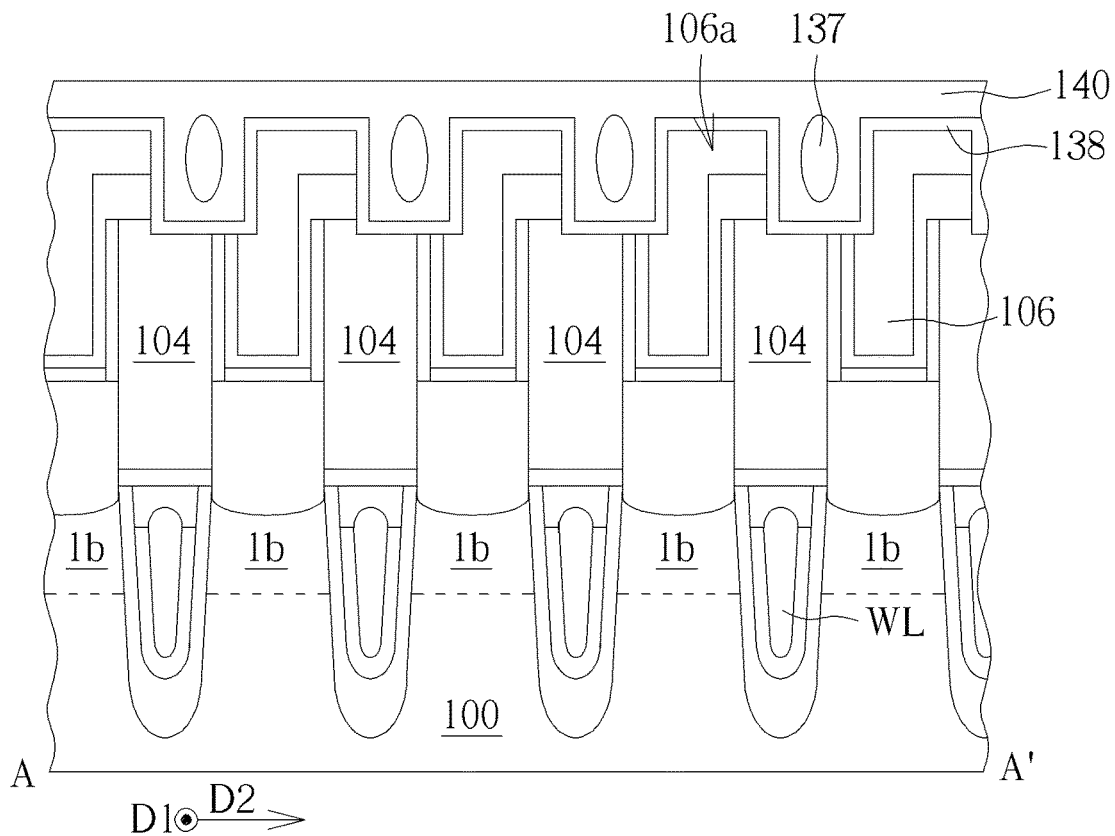
Figure 3B:
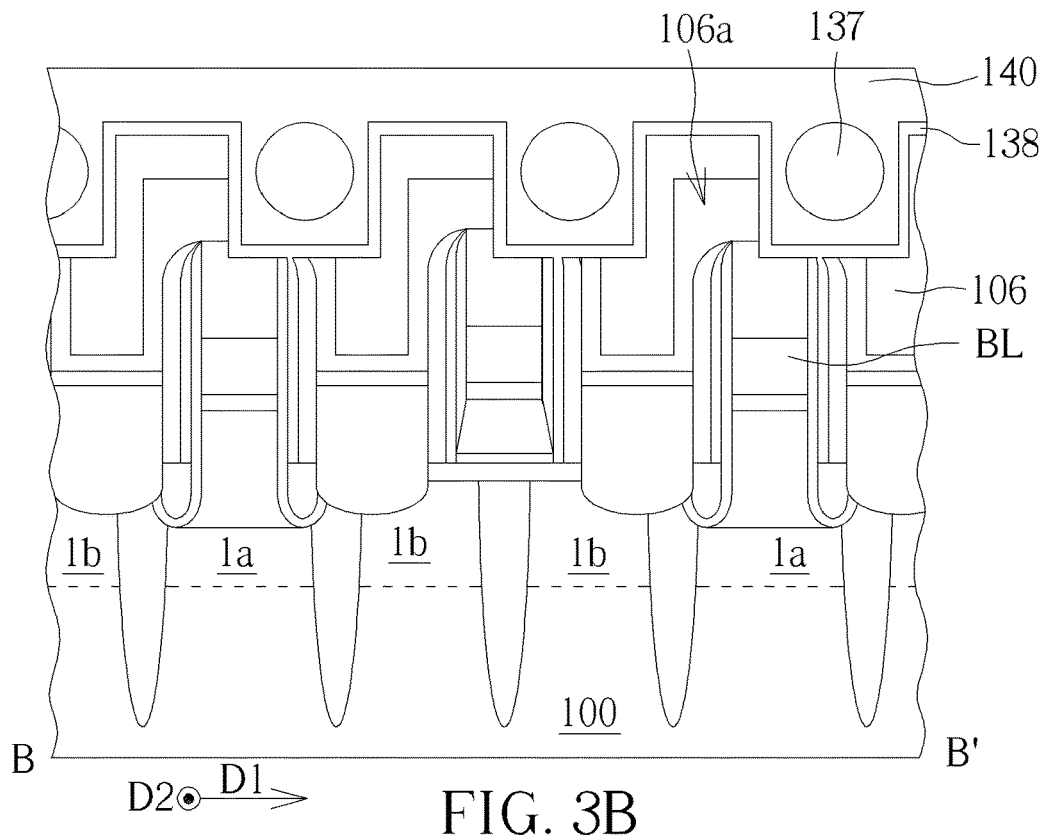

Next, please refer to FIG. 3A and FIG. 3B. After forming the storage node contacts 106 and air gaps 107 at two sides of each bit lines BL, a silicon nitride (SiN) liner 138 is formed on the surface of contact pads 106a, partition structures 104 and bit lines BL. The silicon nitride liner 138 may be formed uniformly and conformally on whole substrate surface by anatomic layer deposition (ALD) process. Thereafter, a silicon oxide (SiO) layer 140, such as tetraethoxysilane (TEOS), is deposited on the silicon nitride liner 138. The silicon oxide layer 140 may be formed by chemical vapor deposition (CVD) process, etc., to fill up the space between the contact pads 106a and cover the whole substrate surface. In addition, a chemical mechanical planarization (CMP) process may be further performed to planarize the surface of silicon oxide layer 140 to improve the roughness of silicon oxide layer 140 and provide a flat process surface.

Please note that, in the embodiment of present invention as shown in FIG. 3A and FIG. 3B, air gaps 137 are formed inside the silicon oxide layer 140 between the contact pads 106a. These air gaps 137 are formed designedly through poor filling capability during the process of forming the silicon oxide layer 140. Similar to the air gaps 107, the presence of air gaps 137 between the contact pads 106a may provide better isolation between the contact pads 106a.

Figure 4:
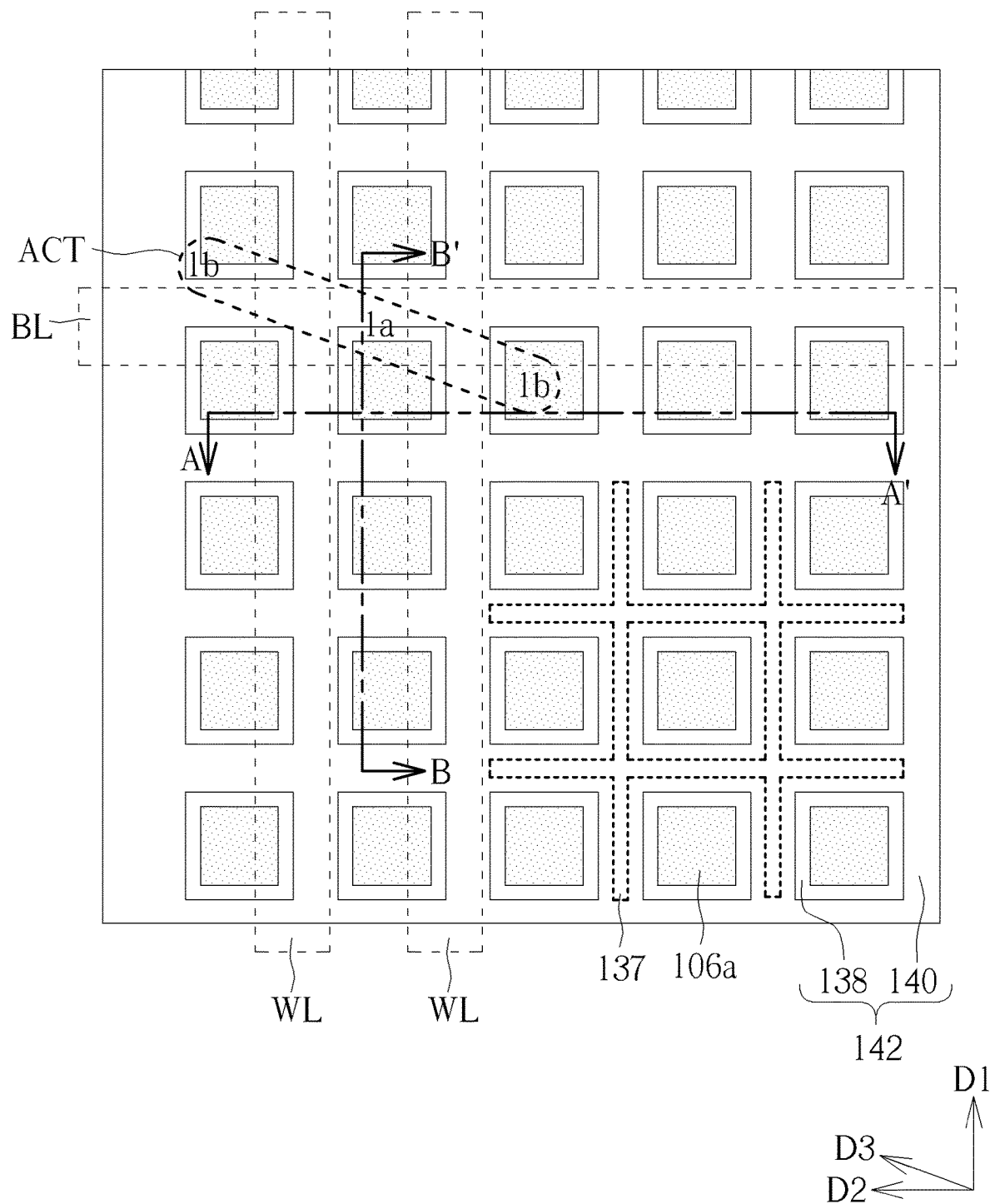
Figure 4A:
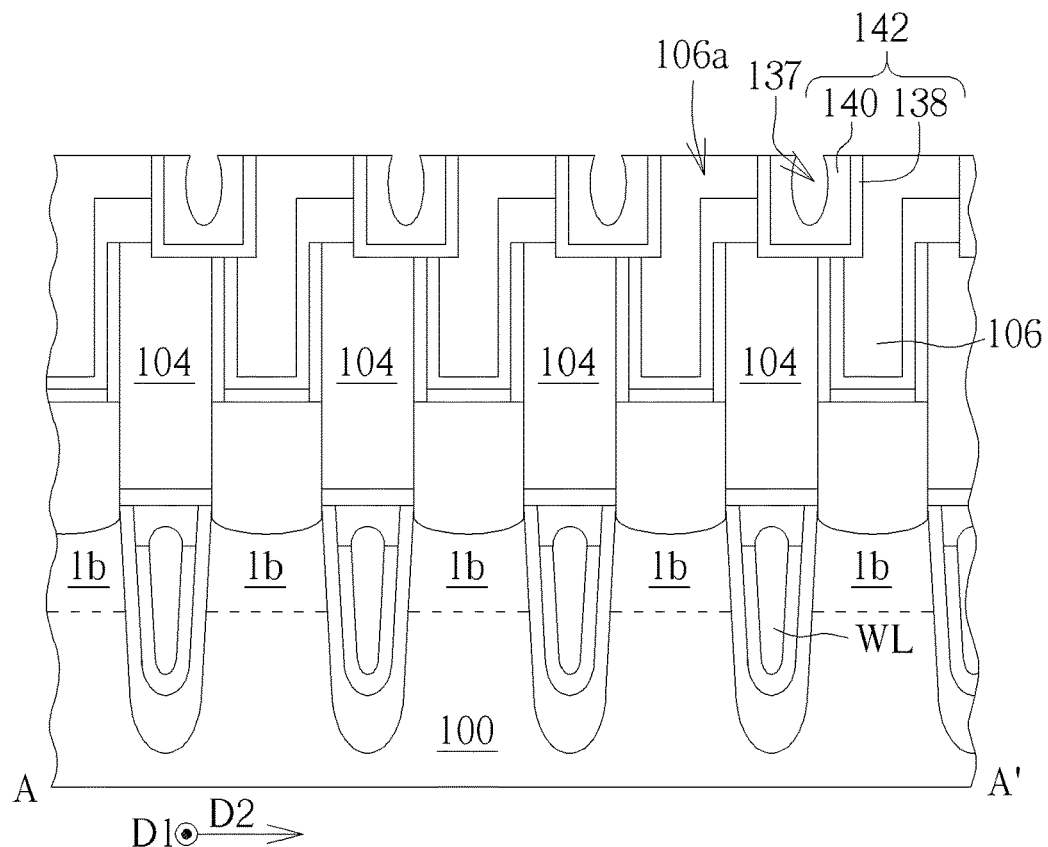
Figure 4B:
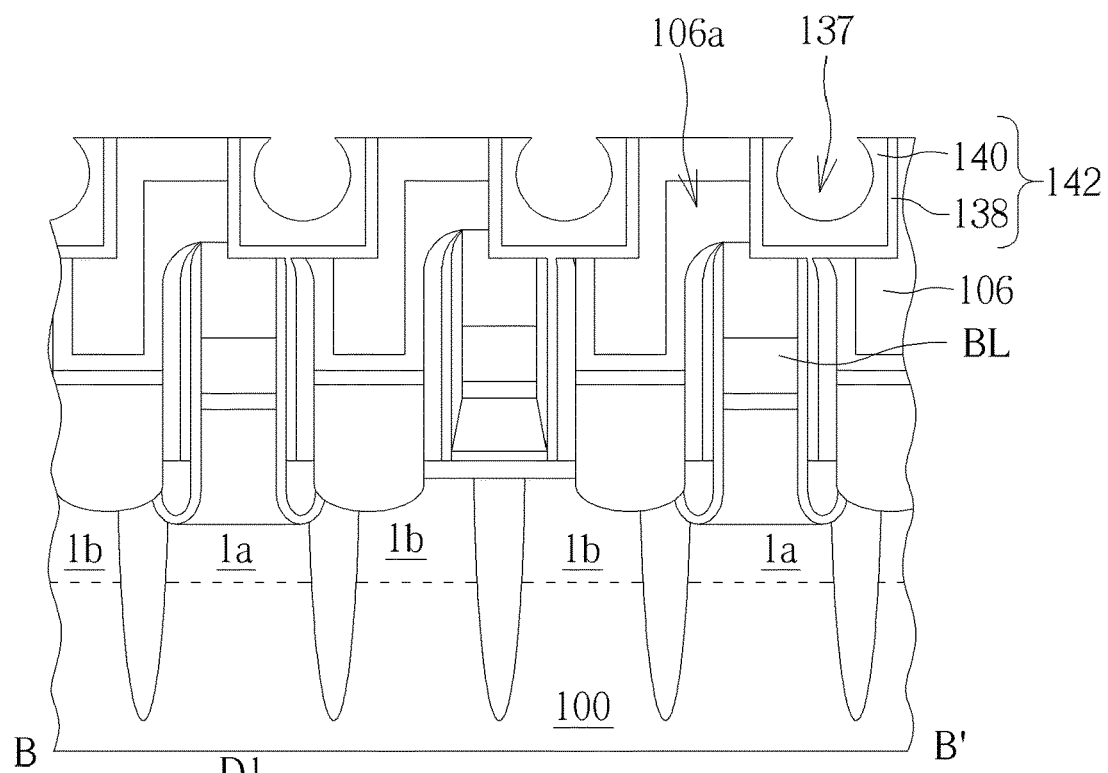

Next, please refer to FIG. 4A and FIG. 4B. After forming the silicon oxide layer 140 and the air gaps 137 therewithin, an etch back process is then performed to remove parts of the silicon oxide layer 140 above the top surface of contact pads 106a. The etch back process would also expose the air gaps 137 inside the silicon oxide layer 140, and the silicon nitride liner 138 on the contact pads 106a are also removed in the process to expose the contact pads 106a thereunder. In the present invention, the silicon oxide layer 140 and the silicon nitride liners 138 between the contact pads 106a may be referred collectively as a contact pad isolation structure 142. The contact pad isolation structure 142 is composed of outer silicon nitride liners 138, an inner silicon oxide layer 140 and air gaps 137 in the inner silicon oxide layer 140, wherein outer silicon nitride liners 138 is formed on the top surface of partition structure 104 and on sidewalls of adjacent contact pad 106a, and the top surfaces of outer silicon nitride liners 138, inner silicon oxide layer 140 and the contact pads 106a are flush after the process. Furthermore, as shown in FIG. 4, the air gaps 137 are formed uniformly between the contact pads 106a arranging in an array on the substrate surface (for the clarity of drawing, only the lower-right part of FIG. 4 are shown with the air gap 137), and each contact pads 106a is surrounded and protected by remaining outer silicon nitride liners 138. Accordingly, in the embodiment, the contact pad isolation structure 142 surrounding the contact pads 106a with three different materials (i.e. silicon nitride, silicon oxide and air gap) may lower total K-value of the materials between the contact pads 106a, thereby reducing parasite capacitance and improving device performance.

Figure 5A:
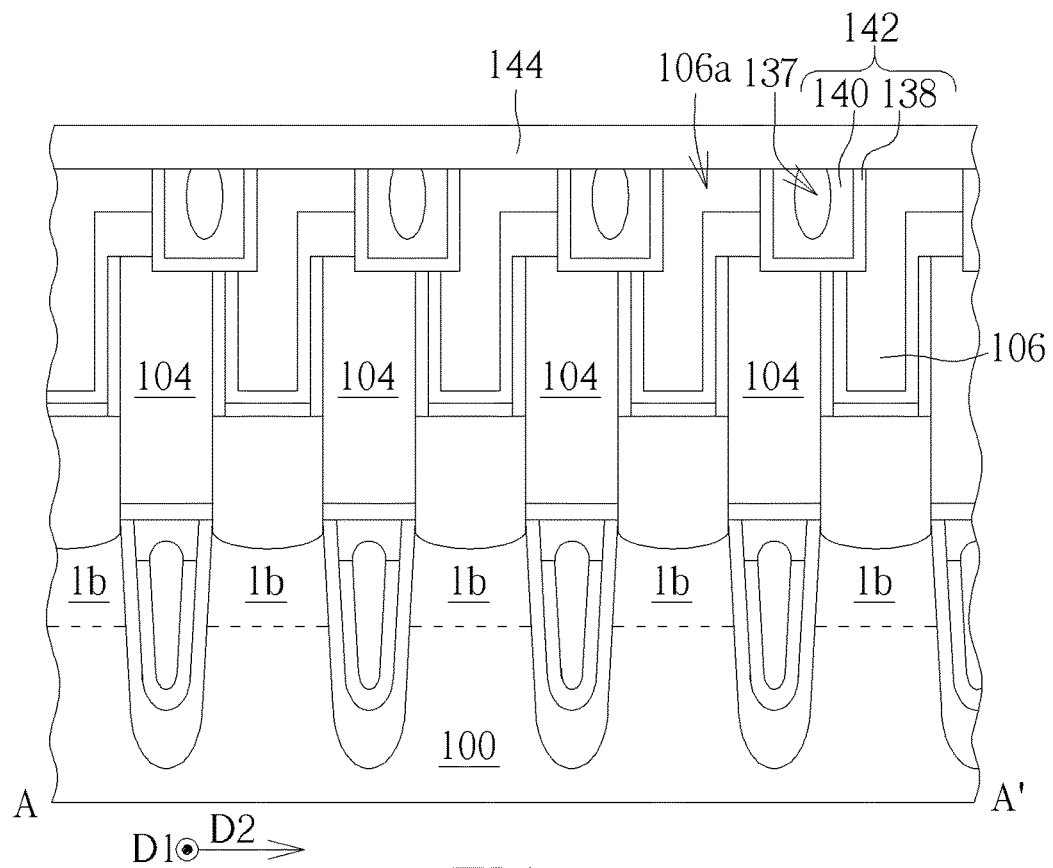
Figure 5B:
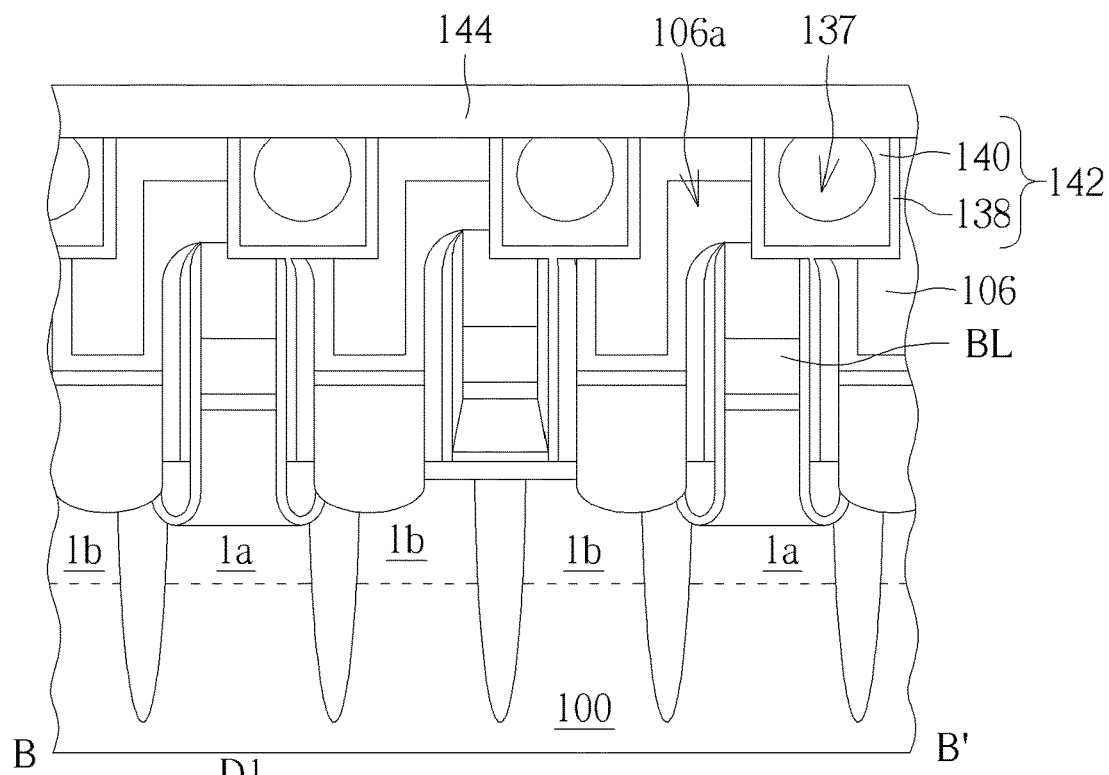

Next, please refer to FIG. 5A and FIG. 5B. After forming the contact pad isolation structure 142, a silicon nitride covering layer 144 may be formed on the contact pads 106a and the contact pad isolation structure 142 to function as a passivation layer to protect the contact pads 106a thereunder during the processes. Please note that in this embodiment silicon nitride covering layer 144 would not fill up the air gap in the silicon oxide layer 140 to maintain the good isolation property.

Figure 6A:
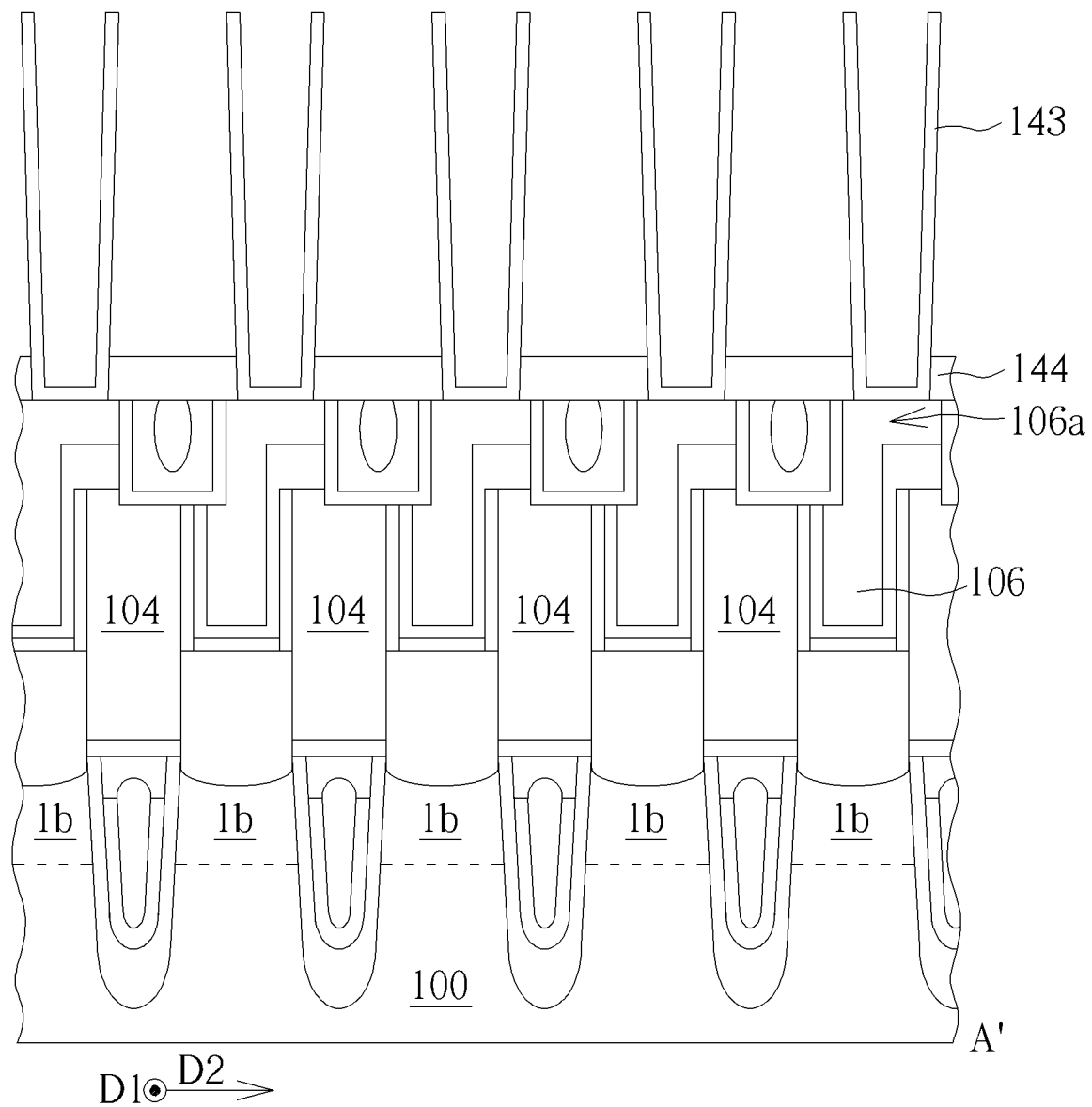
Figure 6B:
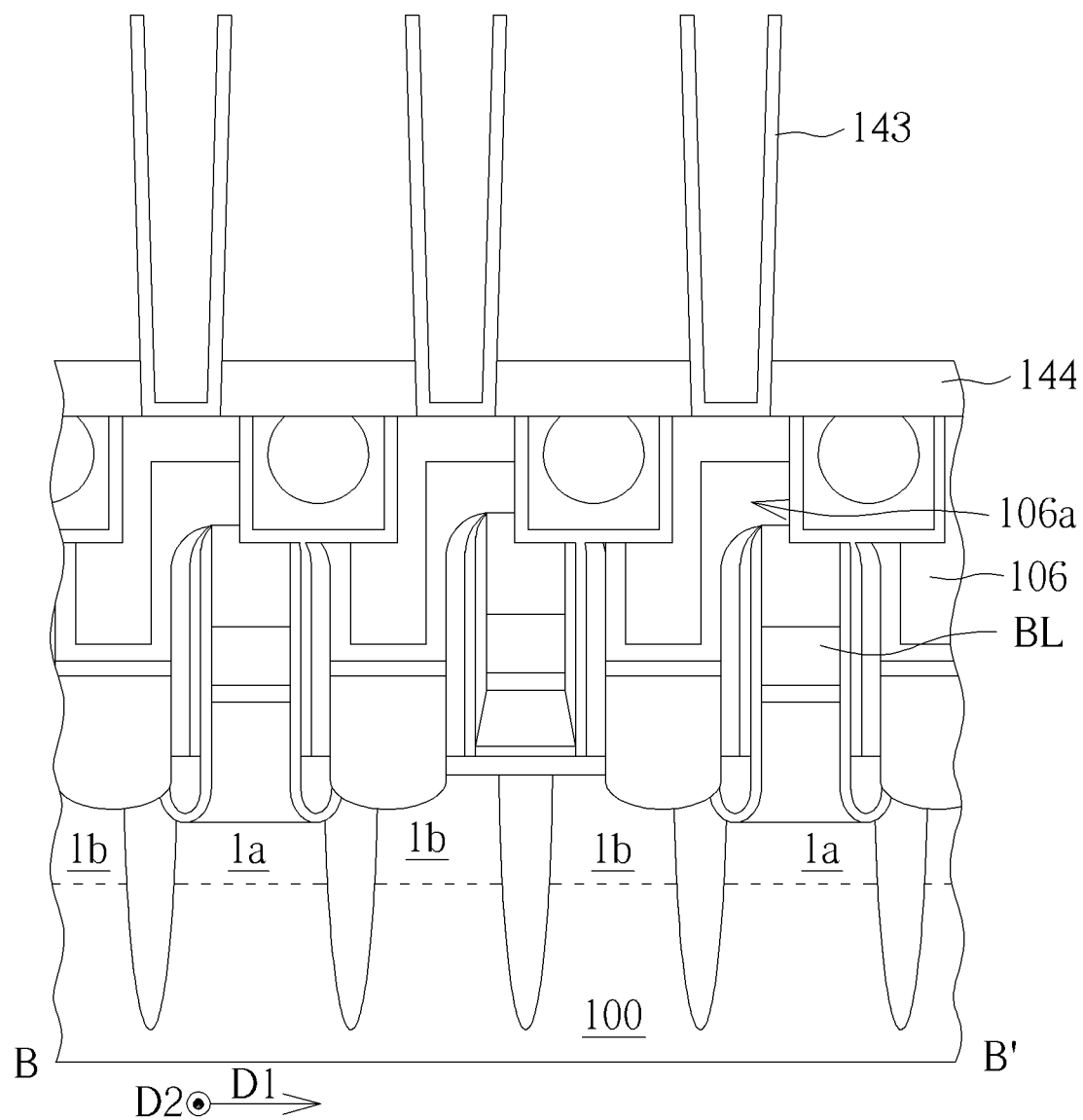
Figure 7A:
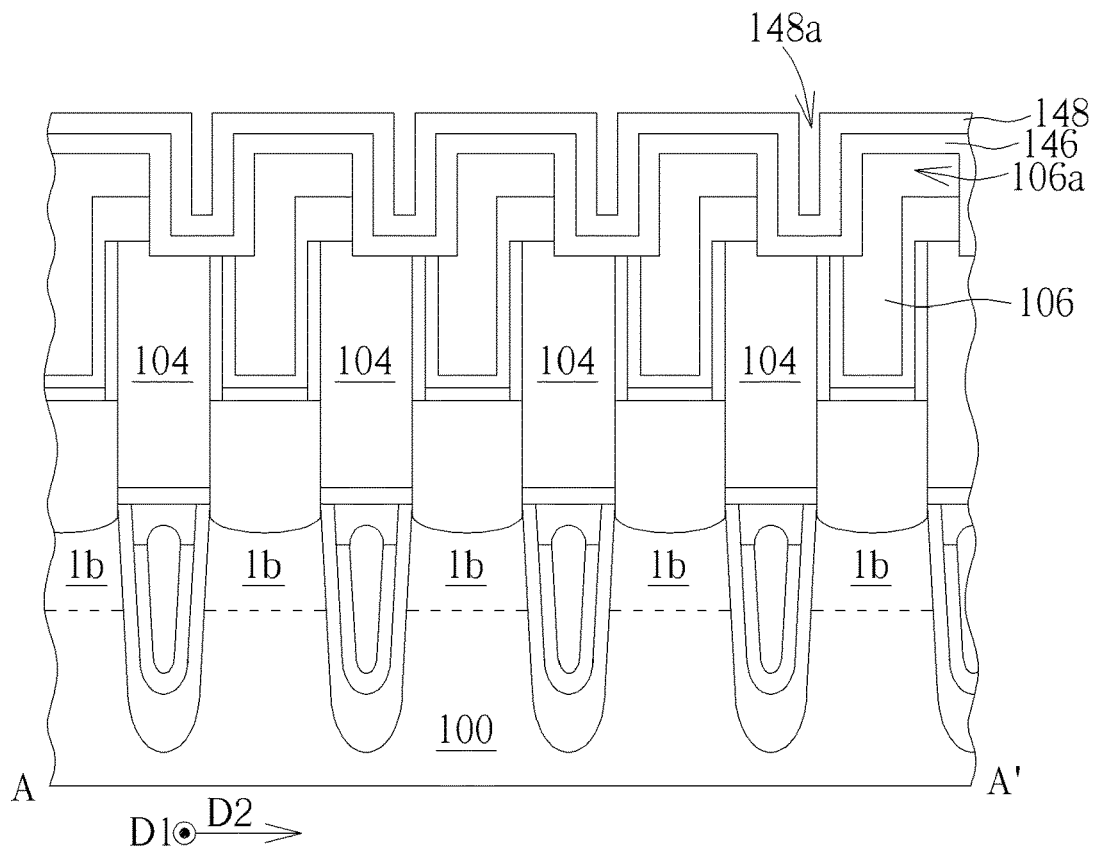
Figure 7B:
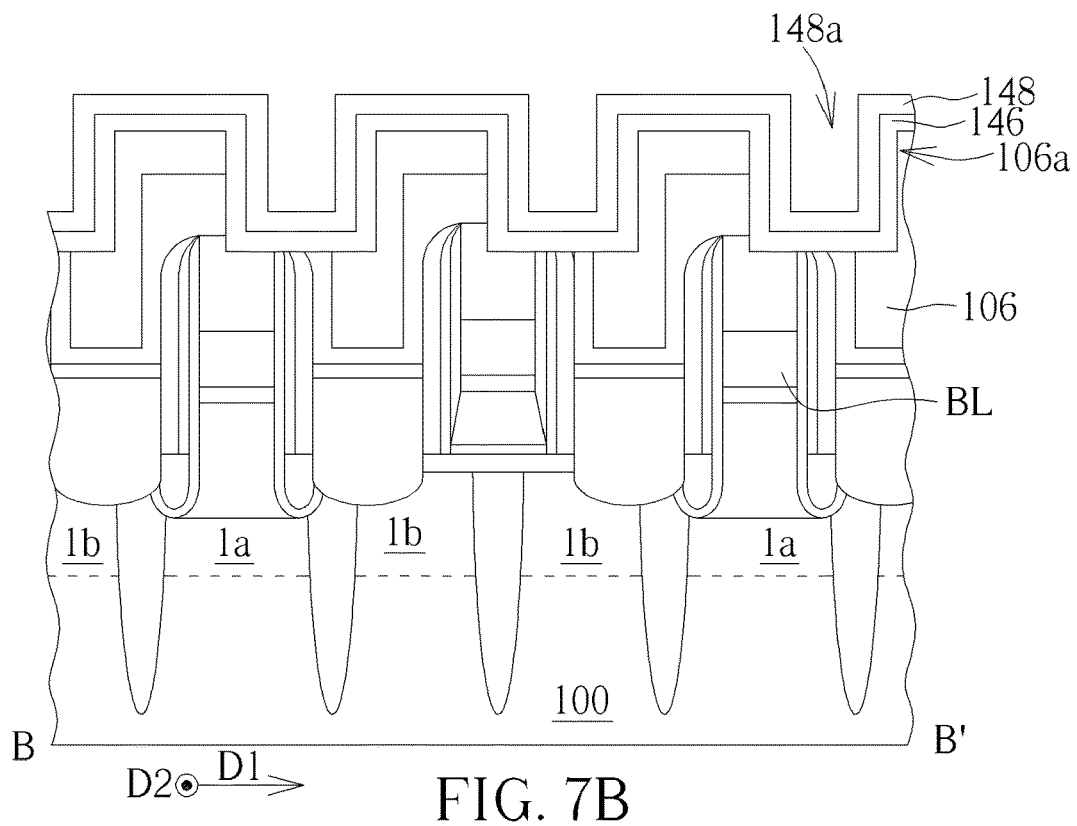

Next, please refer to FIG. 6A and FIG. 6B. After forming the silicon nitride covering layer 144, a photolithography process is then performed to pattern the silicon nitride covering layer 144. The photolithography process would expose the contact pads 106a from the silicon nitride covering layer 144. Thereafter, a capacitor 143 is then formed on each exposed contact pads 106a. Since the capacitors 143 and their forming method are not the key points of present invention, detailed features and process steps relevant to the capacitors 143 will not be described herein in case of obscuring the present invention.

The following embodiment will describe variant of another contact pad isolation structure in the present invention. Please refer to FIG. 7A and FIG. 7B. Follow the step after the storage node contacts 106 are formed in FIG. 1A and FIG. 1B, a silicon nitride liner 146 and a silicon oxide layer 148 may be formed sequentially on the surfaces of contact pads 106a, partition structures 104 and bit lines BL. The silicon nitride liner 146 and the silicon oxide layer 148 may be formed conformally on the whole substrate surface by an atomic layer deposition (ALD) process. Different from the previous embodiment, the silicon oxide layer 148 in this embodiment is conformally formed in the spaces between the contact pads 106a rather than filling up the spaces, so that there will be gaps 148a left between the contact pads 106a.

Figure 8A:
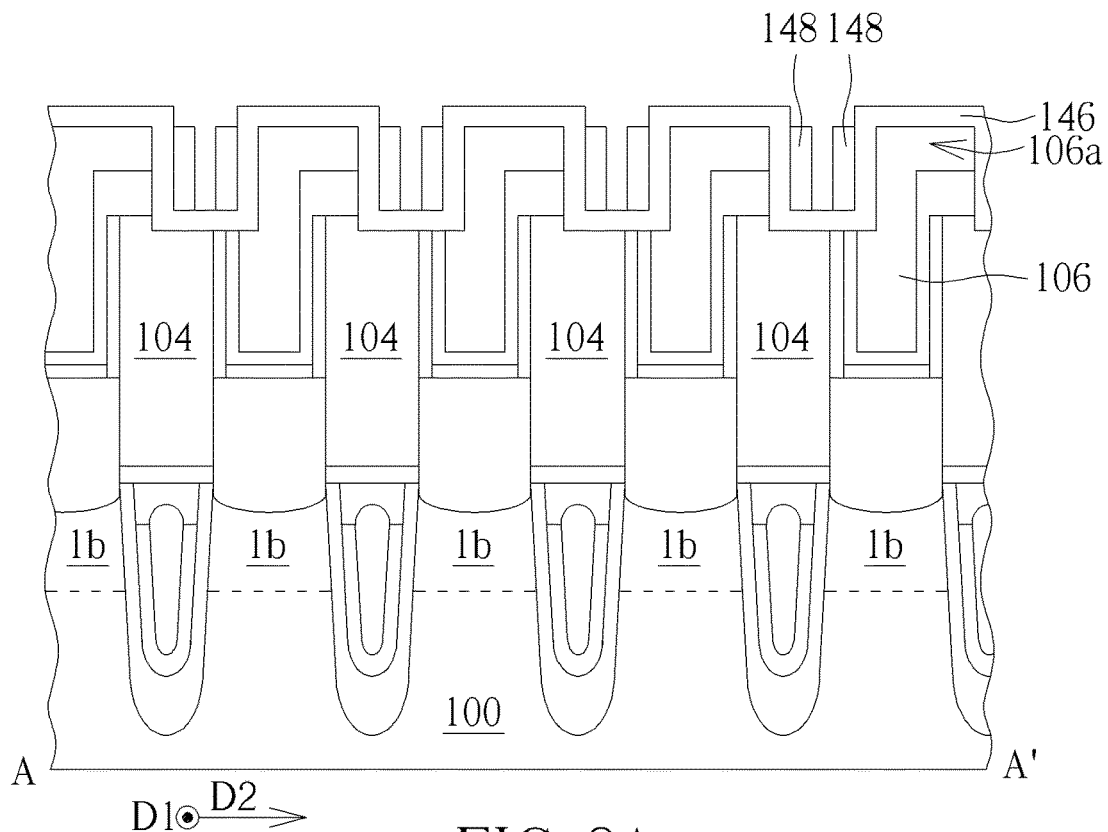
Figure 8B:
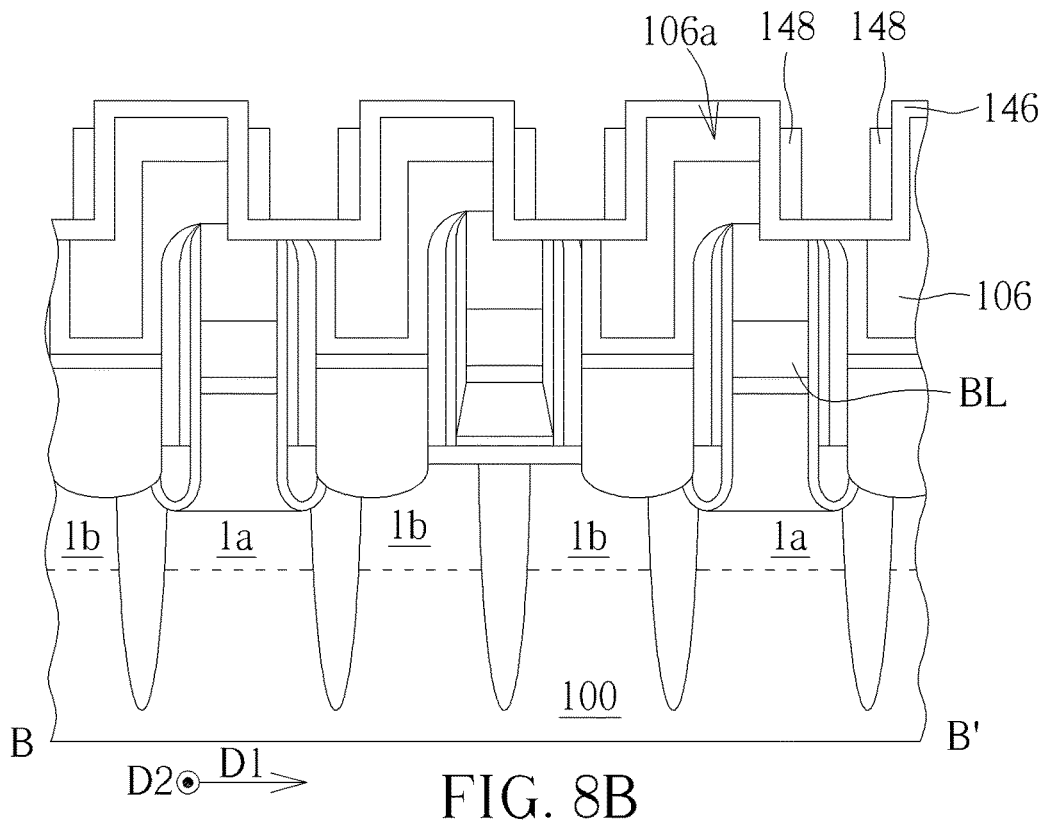

Next, please refer to FIG. 8A and FIG. 8B. After forming the silicon nitride liner 146 and the silicon oxide layer 148, an etch back process is then performed to selectively remove parts of the silicon oxide layer 148, so that only the parts of silicon oxide layer 148 on sidewalls of the contact pads 106a remain. Different from the previous embodiment, please note that in this embodiment the etch back process would not remove any silicon nitride liner 146, and the remaining silicon oxide layer 148 after etch back process will be designedly lower than the top surface of contact pads 106*a*.

Figure 9:
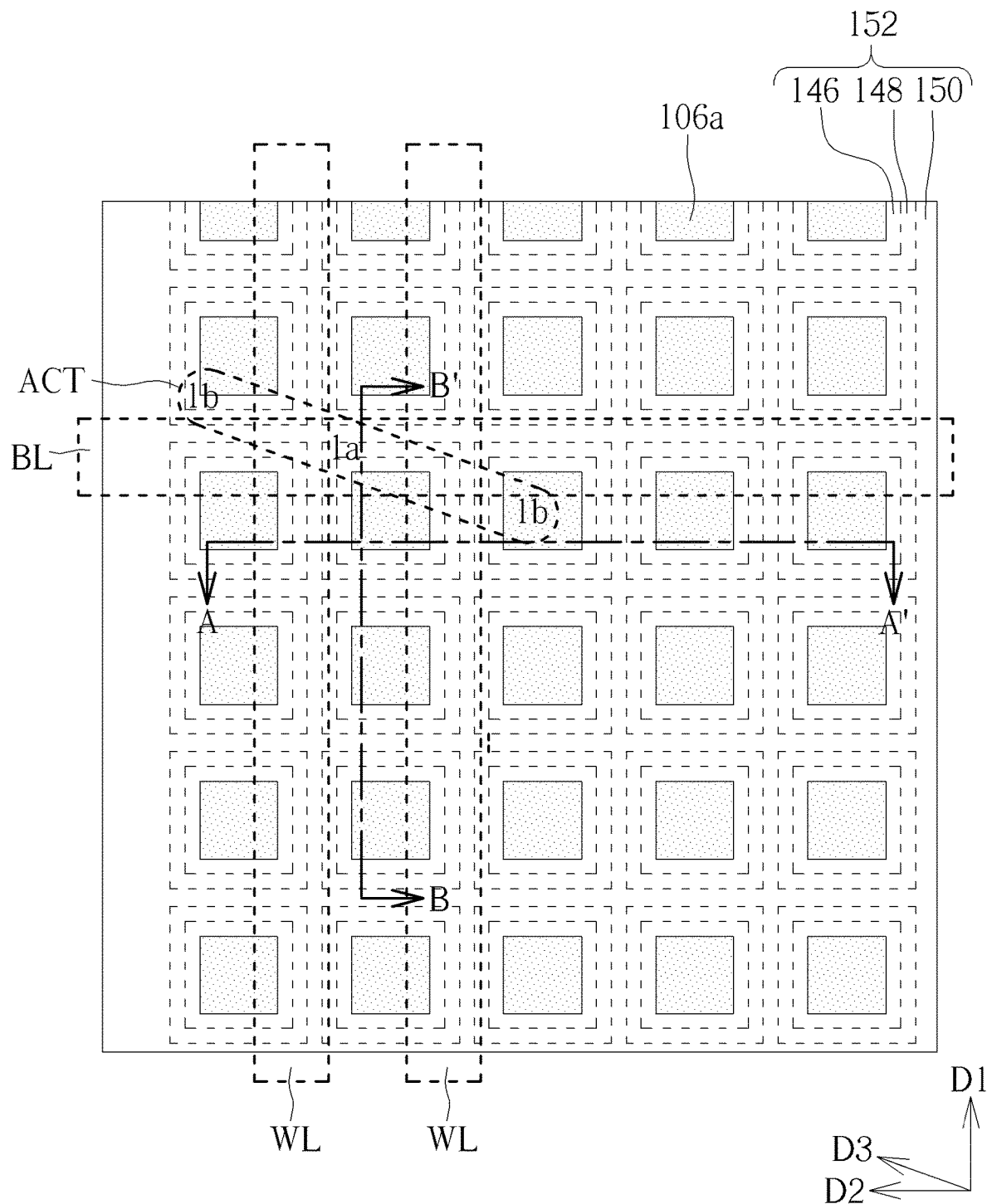
Figure 9A:
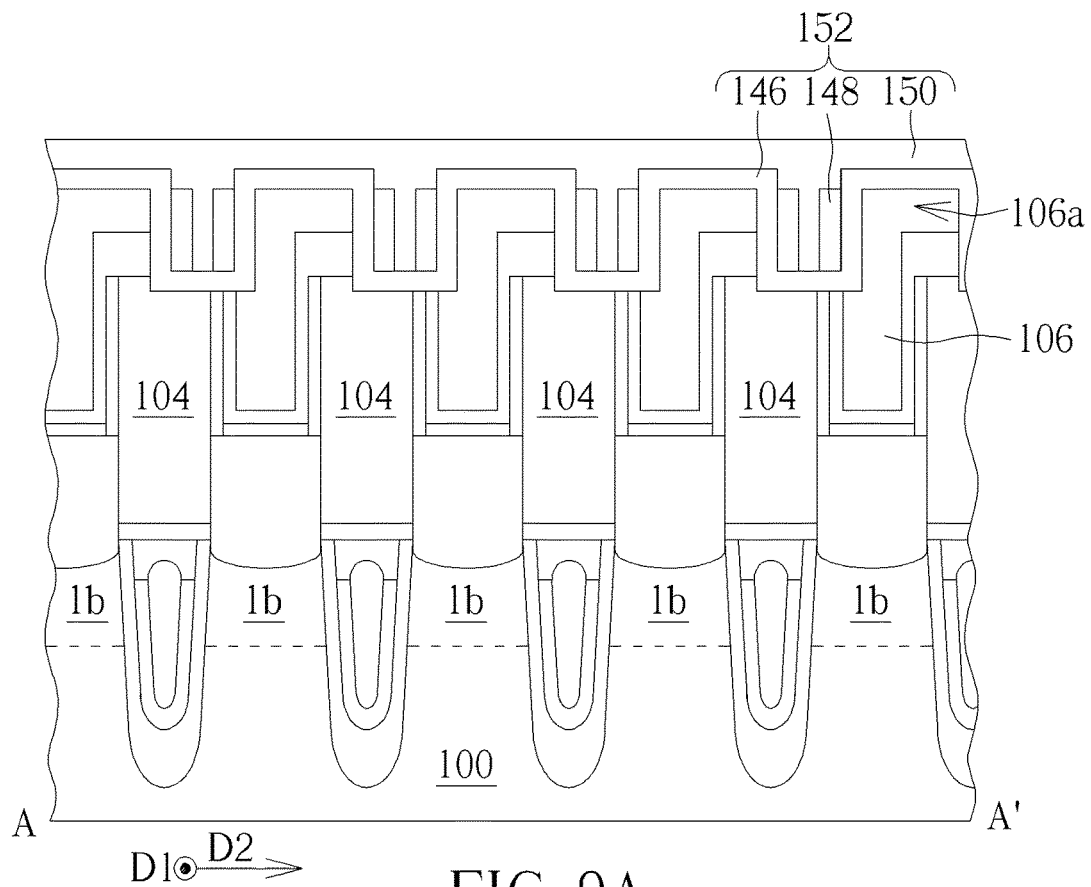
Figure 9B:
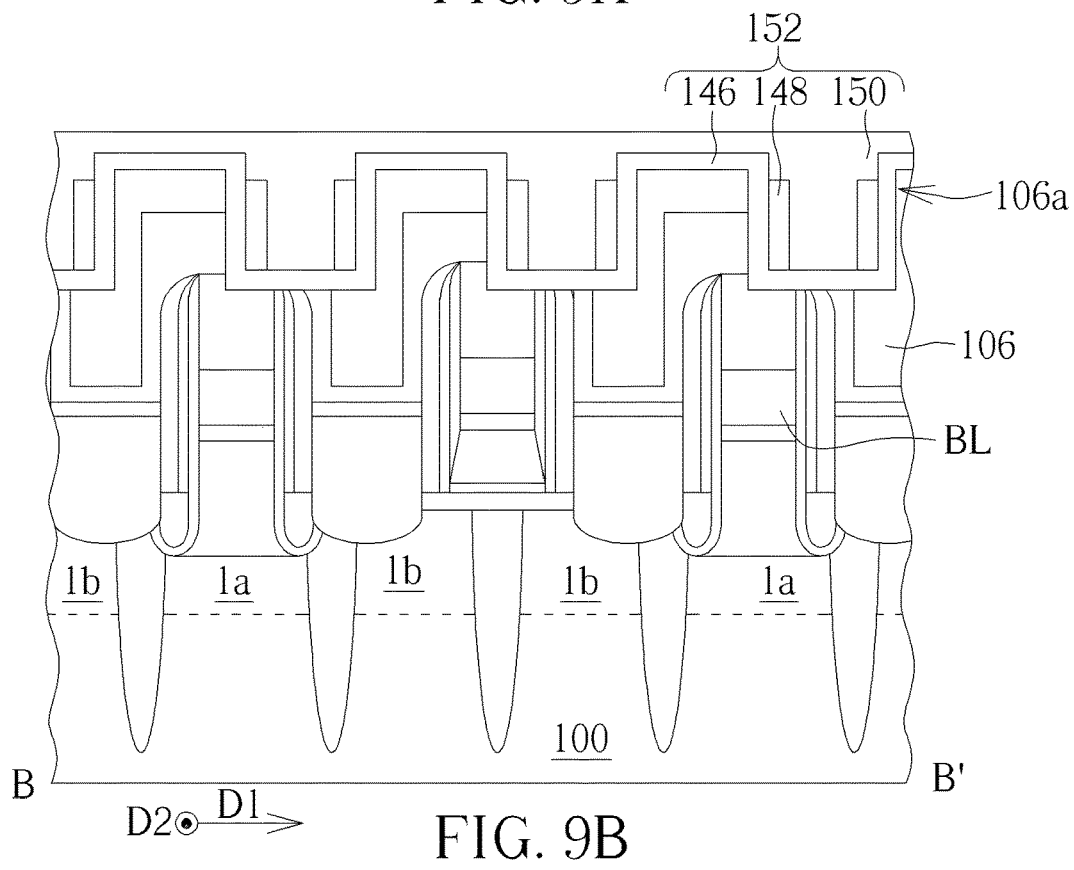
Figure 10A:
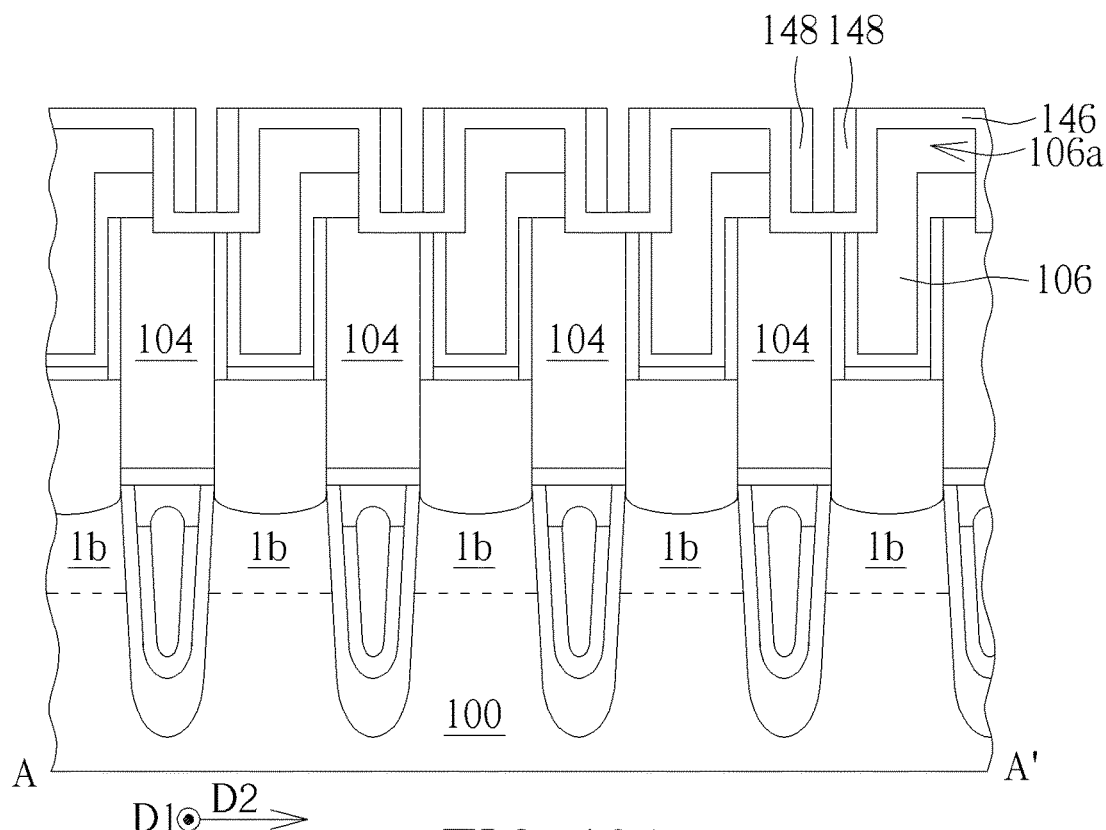
Figure 10B:
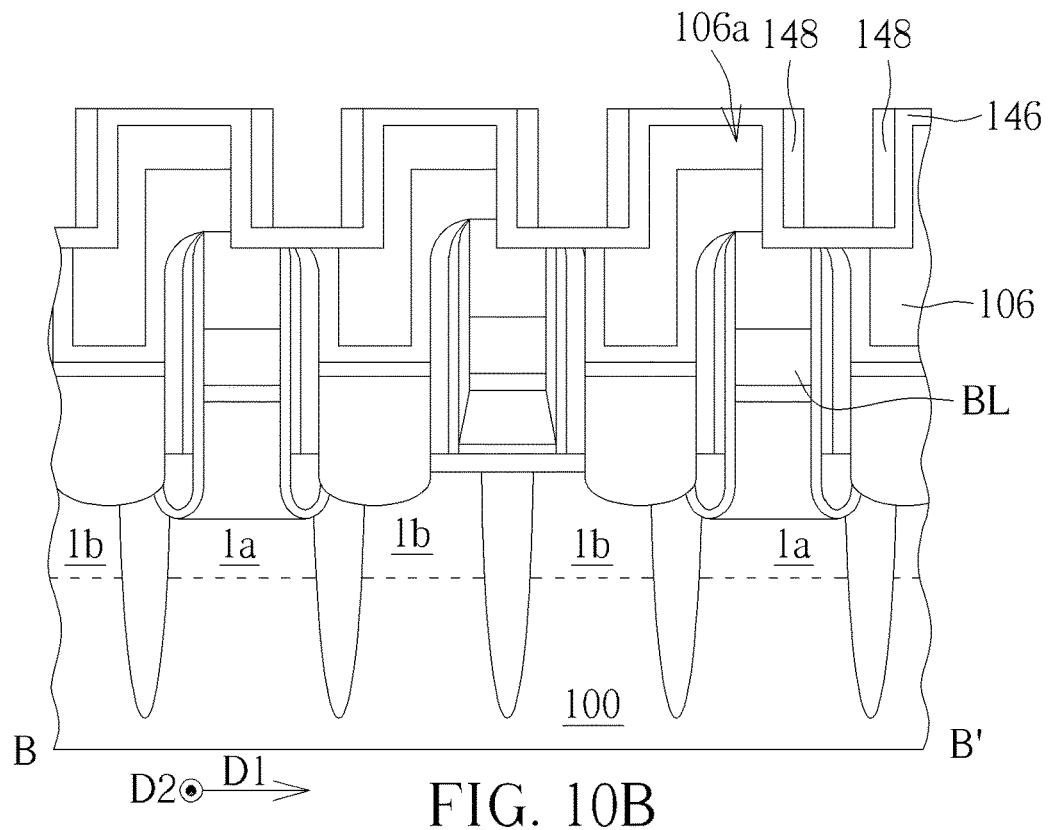

Next, please refer to FIG. 9A and FIG. 9B. After the etch back process, a silicon nitride layer 150 is then formed covering the silicon oxide layer 148 and the silicon nitride liner 146 and filling up the gaps between the contact pads 106*a*, so that the silicon nitride liner 146, the silicon oxide layers 148 and the silicon nitride layer 150 collectively constitute the contact pad isolation structure 152 between the contact pads 106*a*. In the present invention, the contact pad isolation structure 152 is composed of an outer silicon nitride layer (i.e. 146 and 150 with the same materials.) and inner silicon oxide layers 148, wherein each contact pads 106*a* is surrounded and protected by inner silicon oxide layer 148 as shown in FIG. 9. Similarly, in the present invention, the contact pad isolation structure 152 surrounding the contact pads 106*a* with two different materials (i.e. the silicon nitride liner 146/layer 150 and the silicon oxide layer 148) may lower total K-value of the materials between the contact pads 106*a*, thereby reducing parasite capacitance and improving device performance.

The following embodiment will describe variant of still another contact pad isolation structure in the present invention. Please refer to FIG. 10A and FIG. 10B. Follow the step after the conformal silicon nitride liner 146 and silicon oxide layer 148 are formed in FIG. 7A and FIG. 7B, an etch back process is performed to remove parts of the silicon oxide layer 148, so that only the parts of silicon oxide layer 148 on sidewalls of the contact pads 106*a* remain. Different from the previous embodiment of FIG. 8A and FIG. 8B, please note that in this embodiment the top surface of remaining silicon oxide layers 148 after etch back process is preferably flush with the top surface of silicon nitride liner 146.

Figure 11A:
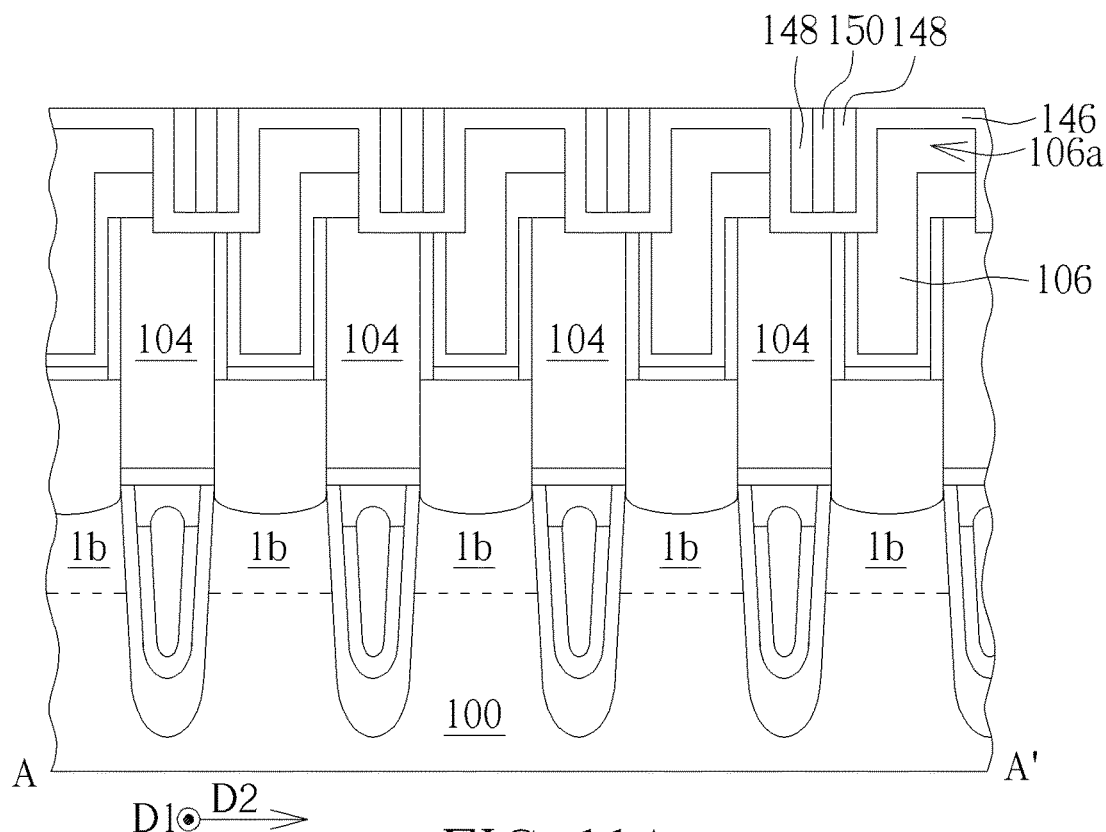
Figure 11B:
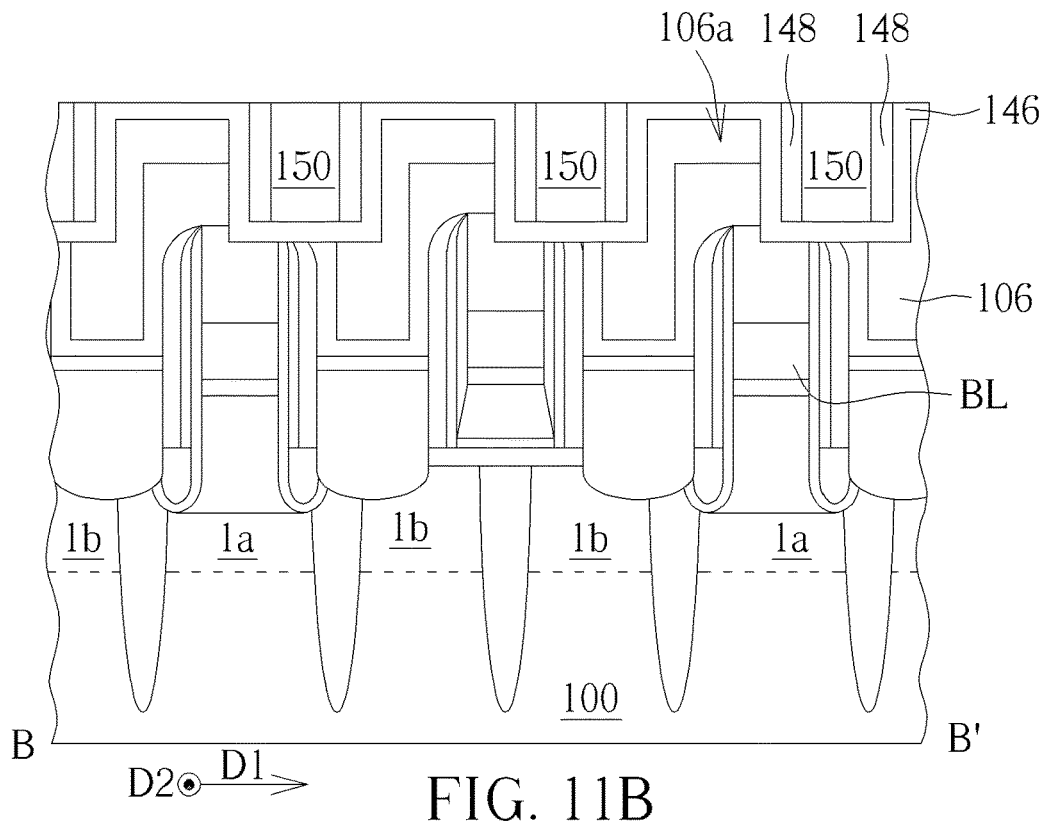

Next, please refer to FIG. 11A and FIG. 11B. After the etch back process, similarly, a silicon nitride layer 150 is formed covering the silicon oxide layers 148 and the silicon nitride liner 146 and filling up the gaps between the contact pads 106*a*. Different form the previous embodiment, another etch back process will be performed in this embodiment to remove the part of silicon nitride layer 150 covering on the silicon oxide layers 148 and the silicon nitride liner 146, so that the silicon oxide layers 148 are exposed.

Figure 12A:
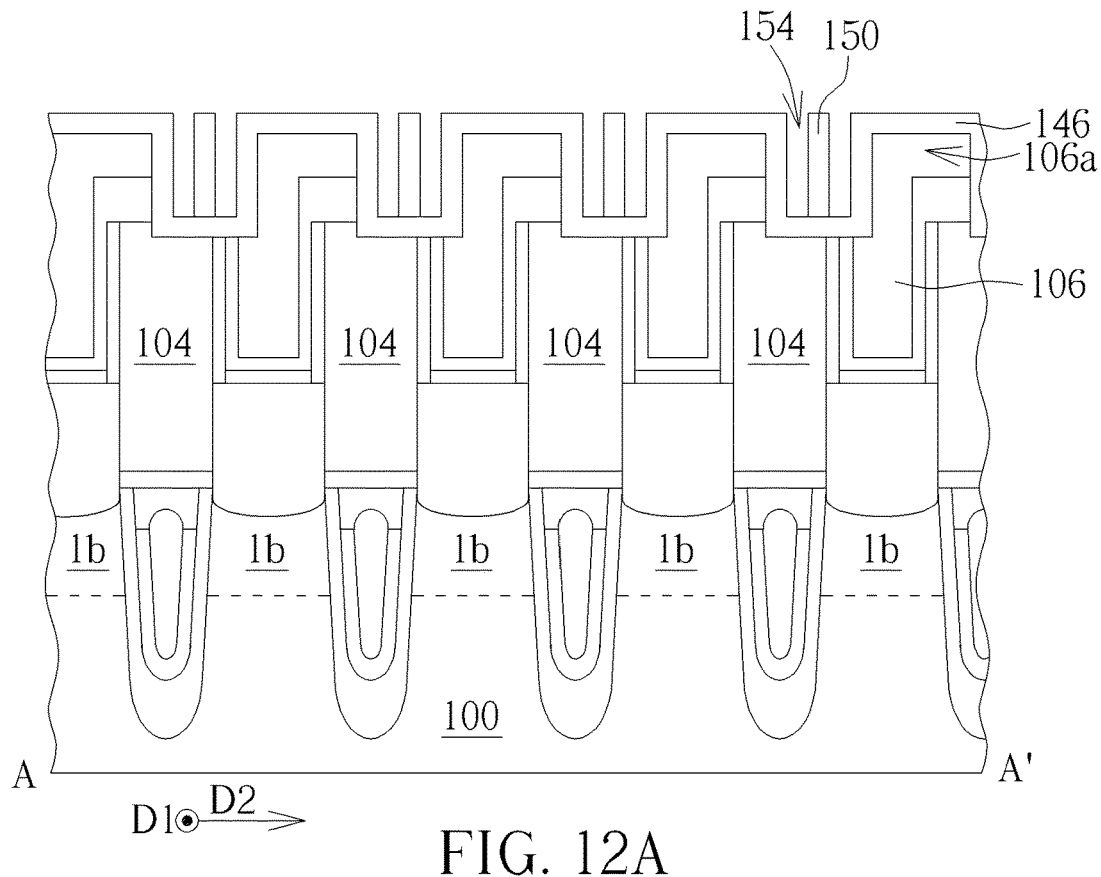
Figure 12B:
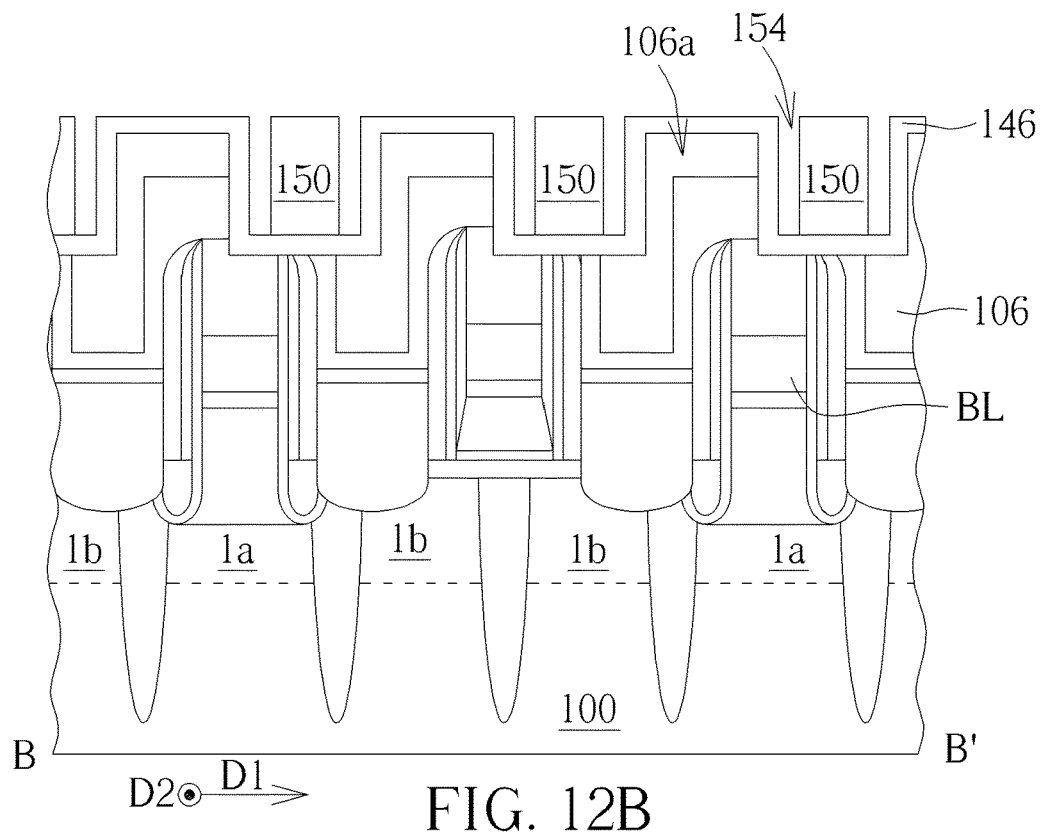
Figure 13:
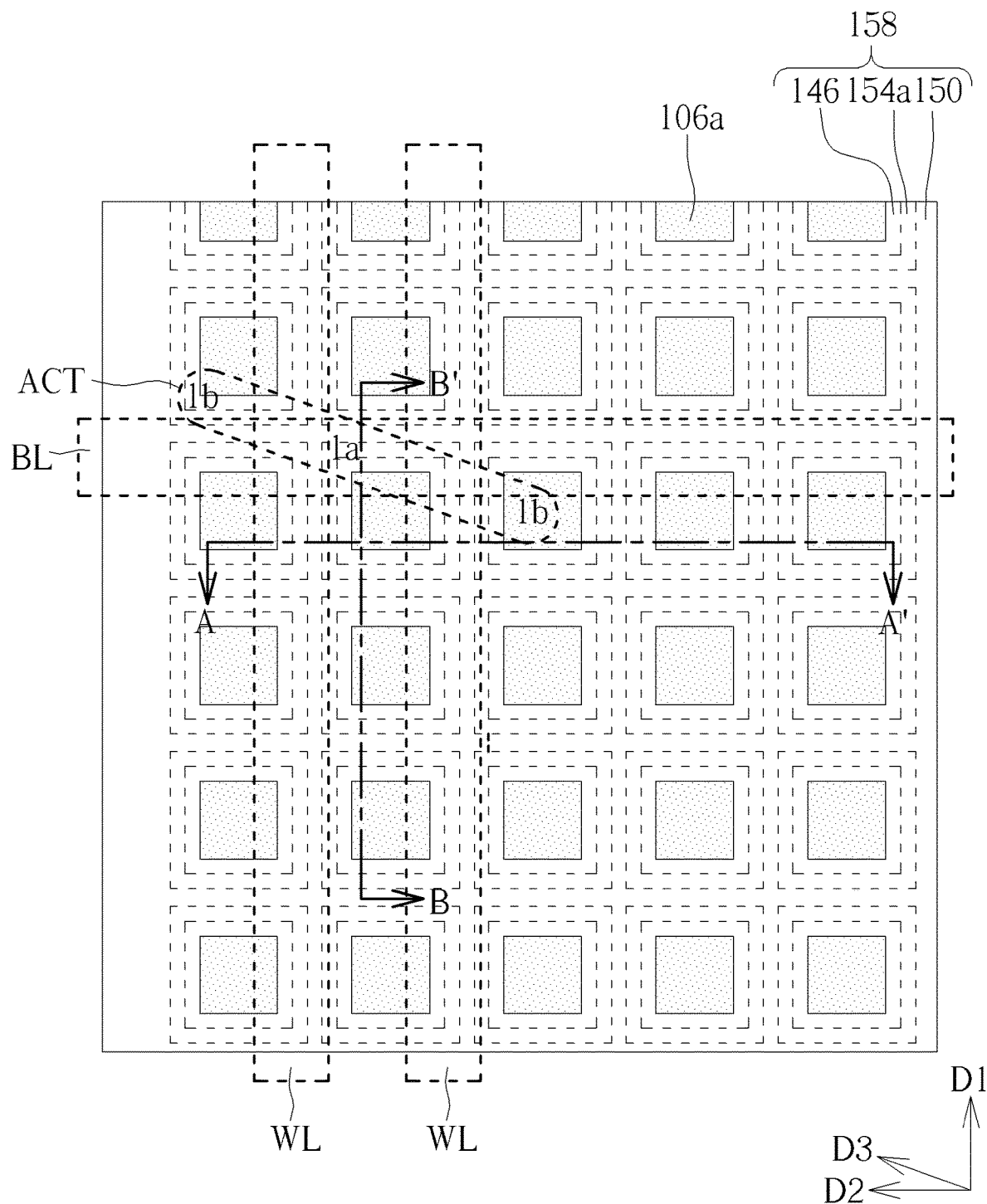
Figure 13A:
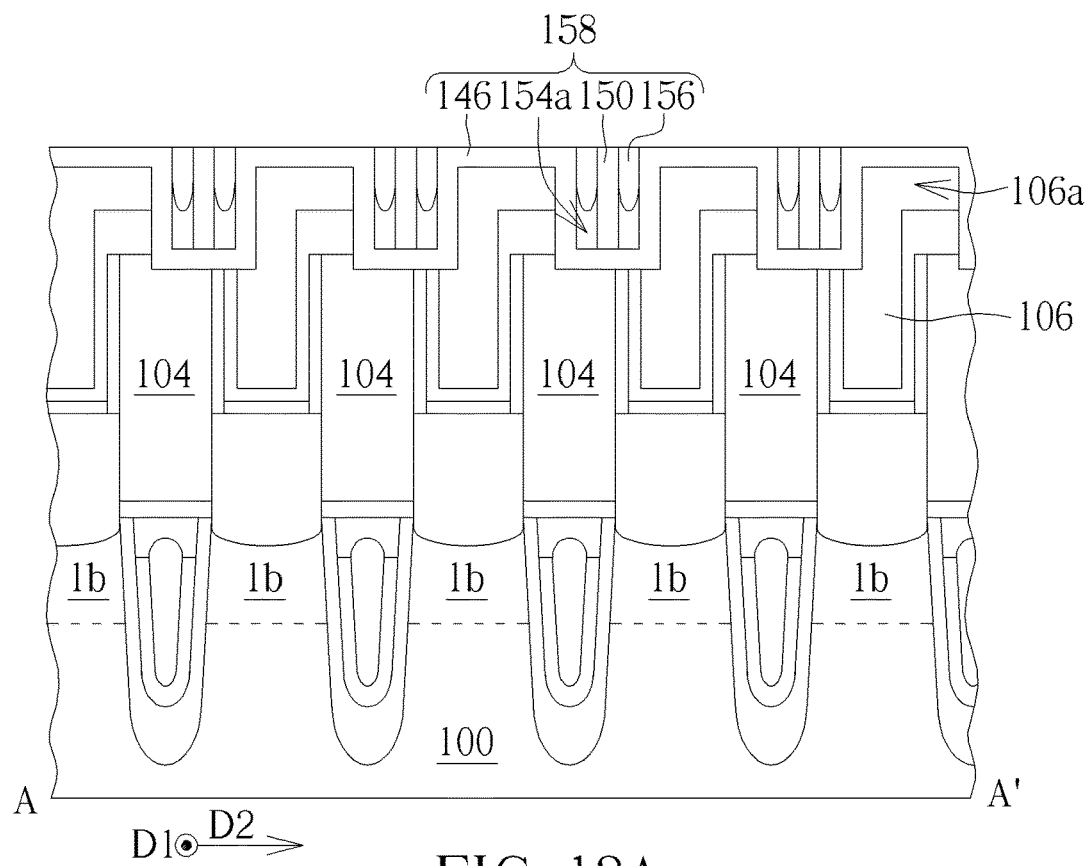
Figure 13B:
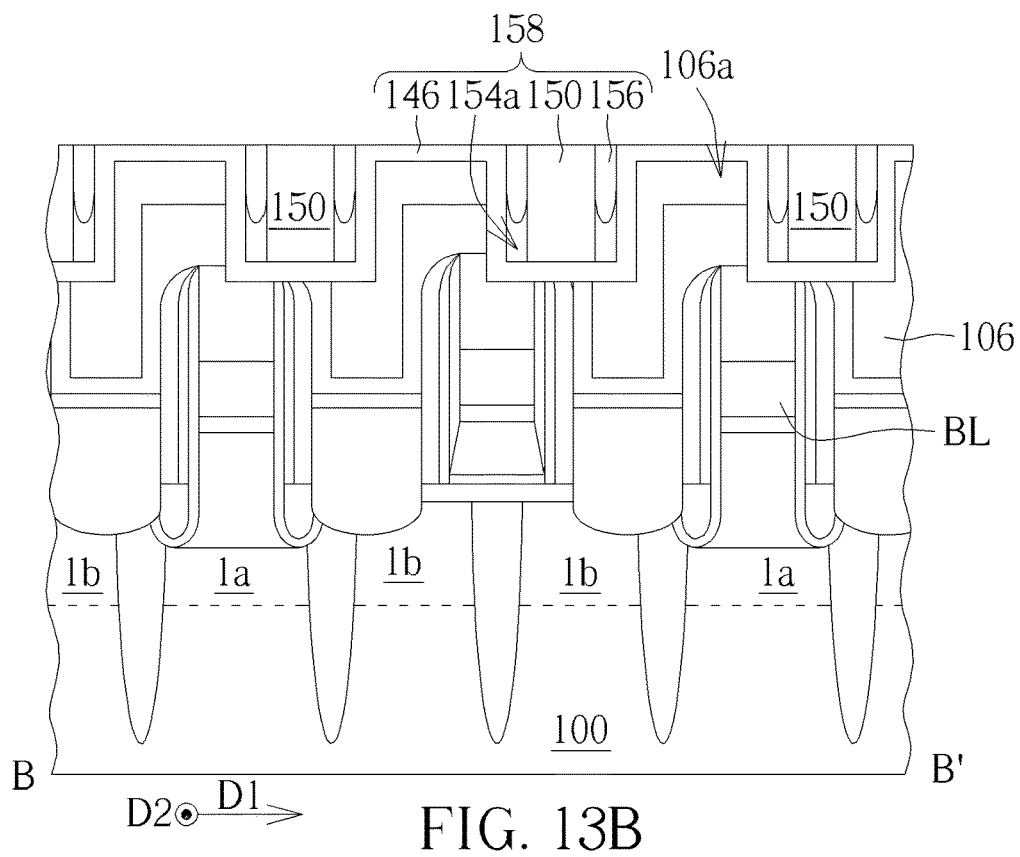

Next, please refer to FIG. 12A and FIG. 12B. After the silicon oxide layer 148*s* are exposed, an etching process is then performed to remove the exposed silicon oxide layers 148, thereby forming air gaps 154 between the silicon nitride liner 146 and the silicon nitride layer 150. Next, please refer to FIG. 13A and FIG. 13B. After forming the air gaps 154, another silicon nitride layer 156 is formed covering on the silicon nitride liner 146, the silicon nitride layers 150 and the air gaps 154, so that the air gap 154 is transformed into a void 154*a*. In this way, the silicon nitride liner 146, the (first) silicon nitride layer 150, the (second) silicon nitride layer 156 and the voids 154*a* collectively constitute a contact pad isolation structure 158 between the contact pads 106*a*. Lastly, an etch back process may be performed optionally to remove the (second) silicon nitride layer 156 on the silicon nitride liner 146 and the (first) silicon nitride layer 150. In the present invention, the contact pad isolation structure 158 is composed of silicon nitride material (i.e. 146, 150, 156 with the same material) and inner voids 154*a*, wherein each contact pads 106*a* is surrounded and protected by inner void 154*a*, as shown in the plane view of FIG. 13. Similarly, in the present invention, the contact pad isolation structure 158 surrounding the contact pads 106*a* with voids 154*a* may lower total K-value of the materials between the contact pads 106*a*, thereby reducing parasite capacitance and improving device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   word lines extending in a first direction in said substrate;
   bit lines extending in a second direction over said word lines;
   partition structures between said bit lines and right above said word lines;
   storage node contacts in spaces defined by said bit lines and said partition structures and electrically connecting with said substrate, wherein a portion of each of said storage node contacts protruding from top surfaces of said bit lines and said partition structures is contact pad; and
   contact pad isolation structures on said partition structures and between said contact pads of said storage node contacts, wherein one air gap is formed inside each of said contact pad isolation structures and said air gaps collectively and fully surround all said contact pads.

2. The semiconductor memory device of claim 1, wherein each said air gap surround one said contact pad.

3. The semiconductor memory device of claim 1, wherein two said air gaps are formed inside each said contact pad isolation structure.

4. The semiconductor memory device of claim 3, wherein two said air gaps align with each other in each said contact pad isolation structure.

5. The semiconductor memory device of claim 1, wherein said contact pad is shifted by a distance in said first direction and said second direction to partially overlap adjacent said bit line and said partition structure.

6. The semiconductor memory device of claim 1, comprising spacers formed on sidewalls of said bit line, wherein each said spacer comprises an inner spacer layer, a middle air gap and an outer spacer layer.

7. A semiconductor memory device, comprising:
   a substrate;
   word lines extending in a first direction in said substrate;
   partition structures right above said word lines;
   storage node contacts in spaces defined by said partition structures and electrically connecting with said substrate, wherein a portion of each of said storage node contacts protruding from top surfaces of said partition structures is contact pad;
   contact pad isolation structures on said partition structures and between said contact pads of said storage node contacts, and one air gap is formed inside each of said contact pad isolation structures, wherein top surfaces of said contact pad isolation structures are flush with top surfaces of said contact pads and said air gaps;
   a covering layer partially and directly on said top surfaces of said contact pad isolation structures and said top surfaces of said contact pads; and
   a capacitor on each of said contact pads through said covering layer.

8. The semiconductor memory device of claim 7, wherein each of said air gap is enclosed by said covering layer and one of said contact pad isolation structures.

9. The semiconductor memory device of claim 8, wherein said air gap inside each of said contact pad isolation structures has only one opening connecting a bottom surface of said covering layer.

10. A semiconductor memory device, comprising:
- a substrate including an active region;
- device isolation layers defining said active region
- bit lines on said active region and crossing over said active region, wherein said bit line comprises a conductive layer and a hard mask layer;
- spacers disposed between said bit lines and storage node contacts disposed between said spacers;
- contact pads disposed on said storage node contacts;
- recesses between said contact pads, wherein at least a part of sidewall of each of said recesses is shared by one of said contact pads;
- contact pad isolation structures disposed in said recesses;
- a covering layer partially disposed on said contact pads and said contact pad isolation structures;
- capacitors on said contact pads through said covering layer; and
- air gaps disposed between said contact pad isolation structures and said covering layer, wherein each of said air gaps is enclosed by said covering layer and one of said contact pad isolation structures, and said air gap inside each of said contact pad isolation structures has only one opening connecting a bottom surface of said covering layer.

11. The semiconductor memory device of claim 10, wherein a top surface of said contact pad isolation structure is coplanar with a top surface of said contact pad.

* * * * *